US008401205B2

(12) United States Patent
Itabashi et al.

(10) Patent No.: US 8,401,205 B2
(45) Date of Patent: Mar. 19, 2013

(54) NOISE CANCELING SYSTEM AND NOISE CANCELING METHOD

(75) Inventors: Tetsunori Itabashi, Kanagawa (JP); Kohei Asada, Kanagawa (JP)

(73) Assignee: Sony Corporation, Tokyo (JP)

( * ) Notice: Subject to any disclaimer, the term of this patent is extended or adjusted under 35 U.S.C. 154(b) by 1081 days.

(21) Appl. No.: 11/868,815

(22) Filed: Oct. 8, 2007

(65) Prior Publication Data

US 2008/0310645 A1 Dec. 18, 2008

(30) Foreign Application Priority Data

Nov. 7, 2006 (JP) ................................ 2006-301247

(51) Int. Cl.
*H03B 29/00* (2006.01)
*H04R 1/10* (2006.01)

(52) U.S. Cl. ........................................ 381/71.6; 381/74

(58) Field of Classification Search ................. 381/71.6, 381/71.11, 71.12, 318, 93, 94.1, 66, 74
See application file for complete search history.

(56) References Cited

U.S. PATENT DOCUMENTS

| | | | | |
|---|---|---|---|---|
| 5,276,740 | A | 1/1994 | Inanaga et al. | |
| 5,600,729 | A * | 2/1997 | Darlington et al. | 381/71.6 |
| 5,815,582 | A * | 9/1998 | Claybaugh et al. | 381/71.6 |
| 6,996,241 | B2 * | 2/2006 | Ray et al. | 381/71.11 |
| 7,031,460 | B1 * | 4/2006 | Zheng et al. | 379/406.06 |
| 8,189,803 | B2 * | 5/2012 | Bergeron et al. | 381/74 |
| 2004/0264706 | A1 * | 12/2004 | Ray et al. | 381/71.11 |
| 2006/0251266 | A1 * | 11/2006 | Saunders et al. | 381/71.1 |
| 2007/0253569 | A1 * | 11/2007 | Bose | 381/71.6 |

FOREIGN PATENT DOCUMENTS

| | | | |
|---|---|---|---|
| JP | 3-96199 | | 4/1991 |
| JP | 3-214892 | | 9/1991 |
| JP | 10-214118 | | 8/1998 |
| JP | 10214118 | A * | 8/1998 |
| JP | 2000-59876 | A | 2/2000 |
| JP | 2002-330485 | A | 11/2002 |
| WO | WO 2005/112849 | A2 | 12/2005 |

OTHER PUBLICATIONS

U.S. Appl. No. 11/936,894, filed Nov. 8, 2007, Asada, et al.
U.S. Appl. No. 11/895,419, filed Oct. 1, 2007, Asada, et al.
U.S. Appl. No. 11/865,354, filed Oct. 1, 2007, Asada.
U.S. Appl. No. 11/875,374, filed Oct. 19, 2007, Asada.
U.S. Appl. No. 11/936,882, filed Nov. 8, 2007, Asada, et al.
U.S. Appl. No. 11/936,876, filed Nov. 8, 2007, Asada, et al.
U.S. Appl. No. 11/952,468, filed Dec. 7, 2007, Asada, et al.
U.S. Appl. No. 12/015,824, filed Jan. 17, 2008, Asada, et al.

(Continued)

*Primary Examiner* — Xu Mei
*Assistant Examiner* — David Ton
(74) *Attorney, Agent, or Firm* — Oblon, Spivak, McClelland, Maier & Neustadt, L.L.P.

(57) ABSTRACT

Disclosed herein is a noise canceling system, including: a first sound collection section configured to collect noise and output a first noise signal; a first signal processing section configured to produce a first noise reduction signal for reducing the noise at a predetermined cancel point; a sound emission section configured to emit noise reduction sound based on the first noise reduction signal; a second sound collection section configured to collect noise and output a second noise signal; and a second signal processing section configured to produce a second noise reduction signal for reducing noise at the cancel point. In the noise canceling system, the sound emission section emitting the noise reduction sound based on the first and second noise reduction signals.

13 Claims, 13 Drawing Sheets

OTHER PUBLICATIONS

Office Action mailed Nov. 1, 2011, in Japanese Patent Application No. 2006-301247, filed Nov. 7, 2006 (with English-language translation).

Japanese Office Action issued Aug. 7, 2012 in Patent Application No. 2006-301247.

* cited by examiner $$P = \frac{1}{1 + ADHM\beta} N + \frac{AHD}{1 + ADHM\beta} ES \quad \ldots(1)$$

$$\left| \frac{1}{1 + ADHM\beta} \right| < 1 \quad \ldots(2)$$

$$E = (1 + ADHM\beta) \quad \ldots(3)$$

$$P = \frac{1}{1 + ADHM\beta} N + ADHS \quad \ldots(4)$$

FIG. 5
$$P = -F'ADHM\alpha N + FN + ADHS \quad \ldots(1)$$
$$F = F'ADHM\alpha \quad \ldots(2)$$
$$P = ADHS \quad \ldots(3)$$
FIG. 6A
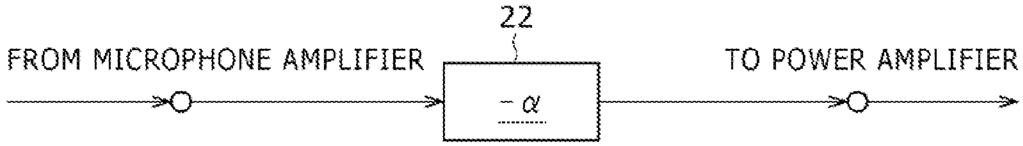
FIG. 6B
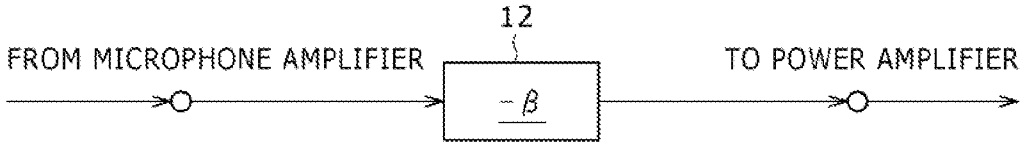
FIG. 6C
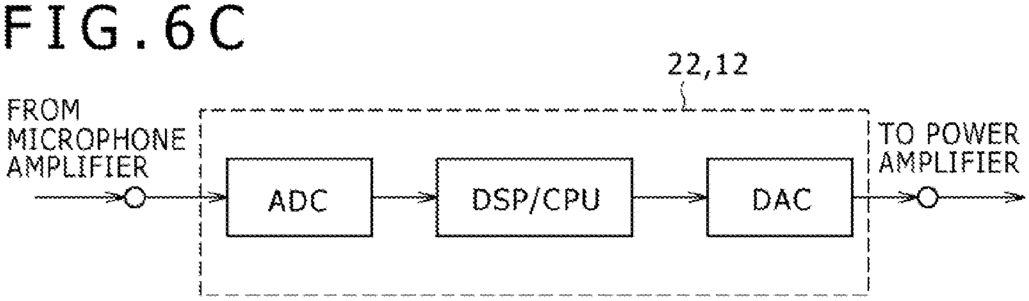

NOISE CANCELING SYSTEM AND NOISE CANCELING METHOD

CROSS REFERENCES TO RELATED APPLICATIONS

The present invention contains subject matter related to Japanese Patent Application JP 2006-301247 filed in the Japan Patent Office on Nov. 7, 2006, the entire contents of which being incorporated herein by reference.

BACKGROUND OF THE INVENTION

1. Field of the Invention

This invention relates to a noise canceling system and a noise canceling method which are applied, for example, to a headphone for allowing a user to enjoy reproduced music or the like and a headset for reducing noise.

2. Description of the Related Art

An active noise reduction system or noise reduction system incorporated in a headphone is available in the past. Noise canceling systems which are placed in practical use at present are all implemented in the form of an analog circuit and are classified into two types including the feedback type and the feedforward type.

A noise reduction apparatus is disclosed, for example, in Japanese Patent Laid-Open No. Hei 3-214892 (hereinafter referred to as Patent Document 1). In the noise reduction apparatus of Patent Document 1, a microphone unit is provided in an acoustic tube to be attached to an ear of a user. Internal noise of the acoustic tube collected by the microphone unit is inverted in phase and emitted from an earphone set provided in the proximity of the microphone unit thereby to reduce external noise.

A noise reduction headphone is disclosed in Japanese Patent Laid-Open No. Hei 3-96199 (hereinafter referred to as Patent Document 2). In the noise reduction headphone of Patent Document 2, when it is attached to the head of a user, a second microphone is positioned between the headphone and the auditory meatus. An output of the second microphone is used to make the transmission characteristic from a first microphone, which is provided in the proximity of the ear when the headphone is attached to the head of the user and collects external sound, to the headphone same as the transmission characteristic of a path along which the external noise reaches the meatus. The noise reduction headphone thereby reduces external noise irrespective of in what manner the headphone is attached to the head of the user.

SUMMARY OF THE INVENTION

Incidentally, a noise canceling system of the feedback type generally has a characteristic that, although the frequency bandwidth within which it can cancel noise or it can reduce noise is comparatively small, noise can be reduced by a comparatively great amount. On the other hand, a noise canceling system of the feedforward type has a wide frequency band within which it can cancel noise and is high in stability. However, it is considered that, when it does not conform to an estimated transfer function depending upon the positional relationship to the noise source, there is the possibility that noise may increase at the frequency.

Therefore, in such a case that a scanning canceling system of the feedforward type which has a wide frequency band within which noise can be canceled and has high stability is used, it is considered that, even if the frequency band within which noise is reduced, if noise within a particular narrow frequency band stands out, then the hearing person may not feel the noise reduction effect.

Therefore, it is demanded to provide a noise canceling system and a noise canceling method by which the frequency band within which noise can be canceled is wide and besides an excellent noise reduction effect can be achieved stably.

According to an embodiment of the present invention, there is provided a noise canceling system including a first sound collection section provided on a housing to be attached to an ear portion of a user and configured to collect noise and output a first noise signal, a first signal processing section configured to produce a first noise reduction signal for reducing the noise at a predetermined cancel point based on the first noise signal, a sound emission section provided on a sound emission direction side with respect to the first sound collection section and configured to emit noise reduction sound based on the first noise reduction signal, a second sound collection section provided on the sound emission direction side of the housing to be attached to the ear portion of the user with respect to the sound emission section and configured to collect noise and output a second noise signal, and a second signal processing section configured to produce a second noise reduction signal for reducing noise at the cancel point based on the second noise signal, the sound emission section emitting the noise reduction sound based on the first and second noise reduction signals.

In the noise canceling system, a noise canceling system section of the feedback type formed from the first sound collection section, first signal processing section and sound emission section and a noise canceling system section of the feedforward type formed from the second sound collection section, second signal processing section and sound emission section can function simultaneously. Thus, noise at the same cancel point is reduced by both of the noise canceling system sections.

Consequently, since a noise component can be attenuated by the noise canceling system section of the feedforward type while also a characteristic of the noise canceling system section of the feedback type is applied additionally, noise can be canceled at a high level over a wide frequency band and a higher noise reduction effect can be achieved.

With the noise canceling system, since the noise canceling system section of the feedforward type and the noise canceling system section of the feedback type are rendered operative, generated noise is attenuated in the inside of the housing by the noise canceling system section of the feedforward type. Further, since also a characteristic of the noise canceling system section itself of the feedback type is added, a higher noise reduction effect can be achieved.

BRIEF DESCRIPTION OF THE DRAWINGS

FIG. 5 is a view illustrating calculation expressions representative of characteristics of the noise canceling system of the feedforward type shown in FIG. 2;

FIGS. 6A, 6B and 6C are block diagrams showing an FF filter, an FB filter and an example of a configuration of the FF filter or the FB filter where it is formed as a digital filter;

DETAILED DESCRIPTION OF THE PREFERRED EMBODIMENT

Noise Canceling System

A system which actively reduces external noise, that is, a noise canceling system, begins to be popularized in headphones and earphones. Almost all noise canceling systems placed on the market are formed from analog circuits and roughly classified into the feedback type and the feedforward type in terms of the noise canceling technique.

Before a preferred embodiment of the present invention is described, examples of a configuration and operation principle of a noise canceling system of the feedback type and examples of a configuration and operation principle of a noise canceling system of the feedforward type are described with reference to FIGS. 1A to 5.

Noise Canceling System of the Feedback Type

First, a noise canceling system of the feedback type is described. FIG. 1A shows a configuration for the right channel side where a headphone system to which a noise canceling system of the feedback type is applied is attached to the head of a user, that is, to the user head HD. Meanwhile, FIG. 1B shows a general configuration of the noise canceling system of the feedback type.

Where the feedback system is applied, generally a microphone 111 is positioned inside a headphone housing (housing section) HP as seen in FIG. 1A. An antiphase component (noise reduction signal) to a signal (noise signal) collected by the microphone 111 is fed back and used for servo control to reduce the noise which is to enter the headphone housing HP from the outside. In this instance, the position of the microphone 111 becomes a cancel point or control point CP which corresponds to the position of the ear of the user. Therefore, the microphone 111 is frequently placed at a position proximate to the ear of the user, that is, on a front face of a diaphragm of an equalizer 16 taking a noise reduction effect into consideration.

Figure 1B:
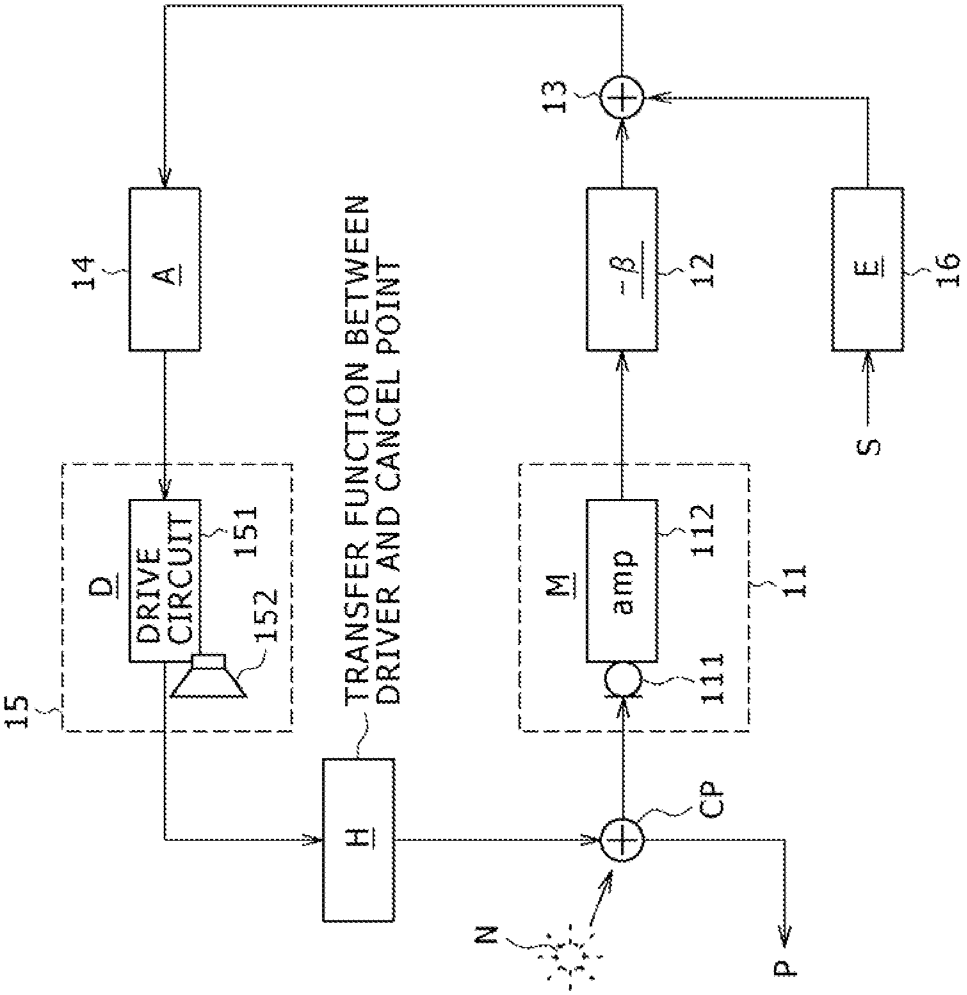
FIGS. 1A and 1B are a schematic view and a block diagram, respectively, showing a noise canceling system of the feedback type.
Figure 1A:
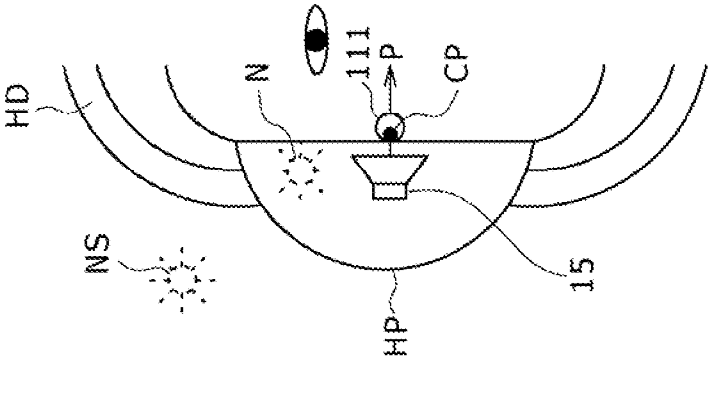

The noise canceling system of the feedback type is described more particularly with reference to FIG. 1B. The noise canceling system of the feedback type shown in FIG. 1B includes a microphone and microphone amplification section 11 including a microphone 111 and a microphone amplifier 112. The noise canceling system further includes a filter circuit (hereinafter referred to as FB filter circuit) 12 designed for feedback control, a synthesis section 13, a power amplifier 14, a driver 15 including a drive circuit 151 and a speaker 152, and an equalizer 16.

The characters A, D, M and −β described in blocks shown in FIG. 1B represent transfer functions of the power amplifier 14, driver 15, microphone and microphone amplification section 11 and FB filter circuit 12, respectively. Similarly, the character E in the block of the equalizer 16 represents the transfer function of the equalizer 16 to be multiplied to a signal S of an object of hearing, and the character H of a block placed between the driver 15 and the cancel point CP represents the transfer function of the space from the driver 15 to the microphone 111, that is, the transfer function between the driver and the cancel point. The transfer functions mentioned are represented in complex representations.

Referring to FIGS. 1A and 1B, the character N represents noise entering from a noise source NS on the outside to a portion around the position of the microphone in the headphone housing HP, and the character P represents the sound pressure or output sound coming to the ear of the user. The cause of the entrance of the noise N into the headphone housing HP is, for example, sound leaking as a sound pressure from a gap of the ear pad of the headphone housing HP or sound transmitted to the inside of the housing as a result of vibration of the headphone housing HP caused by such sound pressure applied thereto.

Figures 3, 4:
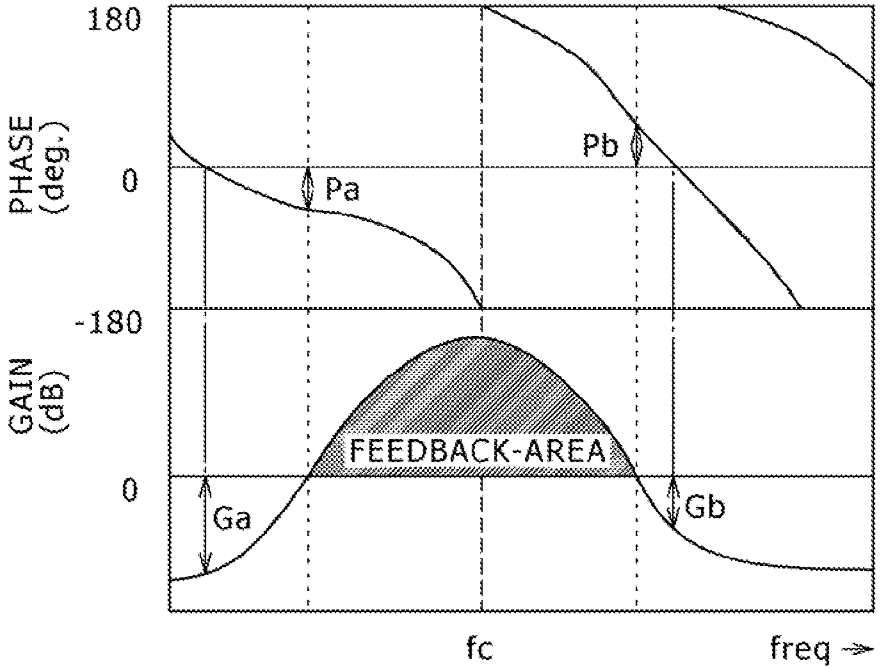
FIG. 3 is a view illustrating calculation expressions representative of characteristics of the noise canceling system of the feedback type shown in FIG. 1.
FIG. 4 is a board diagram illustrating a phase margin and a gain margin in the noise canceling system of the feedback type.

At this time, the sound pressure P coming to the ear of the user in FIG. 1B can be represented by an expression (1) in FIG. 3. If attention is paid to the noise N in the expression (1) in FIG. 3, it can be recognized that the noise N attenuates to 1/(1+ADHMβ). In order for the system of the expression (1) of FIG. 3 to operate stably as a noise canceling mechanism within a noise reduction object frequency band, it is necessary for an expression (2) in FIG. 3 to be satisfied.

Generally, since the absolute value of the product of the transfer functions in a noise canceling system of the feedback type is higher than 1 (1<<ADHMβ), the stability of the system according to the expression (2) of FIG. 3 can be interpreted in the following manner together with decision of the stability of Nyquist in old control theories.

An "open loop" produced when a loop relating to the noise N is cut at one place (−ADHMβ) in FIG. 1B is considered. For example, if the cut portion is provided between the microphone and microphone amplification section 11 and the FB filter circuit 12, then an "open loop" can be formed. This open loop has such a characteristic as is represented, for example, by such a board diagram as seen in FIG. 4.

Where this open loop is selected as an object, from the stability decision of Nyquist, two conditions of (1) that, when the phase passes a point of 0 degree, the gain must be lower than 0 dB (0 decibel) and (2) that, when the gain is higher than 0 dB, the phase must not include a point of 0 degree.

If any of the conditions (1) and (2) above is not satisfied, then positive feedback is applied to the loop, resulting in oscillation (howling) of the loop. In FIG. 4, reference characters Pa and Pb individually represent a phase margin, and Ga and Gb individually represent a gain margin. Where such margins are small, the possibility of oscillation is high depending upon the personal differences among users who utilize a headphone to which the noise canceling system is applied and upon the dispersion in mounting of the headphone.

In particular, the axis of abscissa in FIG. 4 indicates the frequency while the axis of ordinate indicates the gain and the phase at lower and upper halves thereof, respectively. Then, when the phase passes a point of 0 degree, as seen from the gain margins Ga and Gb in FIG. 4, if the gain is lower than 0 dB, then positive feedback is applied to the loop, resulting in oscillation. However, when the gain is equal to or higher than 0 dB, unless the phase does not include a point of 0 degree, positive feedback is applied to the loop, resulting in oscillation, as seen from the phase margins Pa and Pb in FIG. 4.

Now, reproduction of necessary sound from the headphone in which the noise securing system of the feedback type shown in FIG. 1B is incorporated is described in addition to the noise reduction function described above. The input sound S in FIG. 1B is a general term of a sound signal to be reproduced originally by the driver of the headphone such as, for example, a music signal from a music reproduction apparatus, sound of the microphone outside the housing (where the headphone is used as a hearing aid function) or a sound signal by communication such as telephone communication (where the headphone is used as a headset).

If attention is paid to the input sound S in the expression (1) in FIG. 3, the transfer function E of the equalizer 16 can be represented by the expression (3) in FIG. 3. Further, if also the transfer function E of the equalizer 16 in the expression (3) of FIG. 3 is taken into consideration, the sound pressure P of the noise canceling system of FIG. 1B can be represented by an expression (4) in FIG. 3.

If it is assumed that the position of the microphone 111 is very proximate to the position of the ear, then since the character H represents the transfer function from the driver 15 to the microphone (ear) 111 and the characters A and D represent the transfer functions of the power amplifier 14 and the driver 15, respectively, it can be recognized that a characteristic similar to that of an ordinary headphone which does not have the noise reduction function is obtained. It is to be noted that the transfer function E of the equalizer 16 in this instance is substantially equivalent to an open loop characteristic as viewed on the frequency axis.

Noise Canceling System of the Feedforward Type

Figures 2A, 2B:
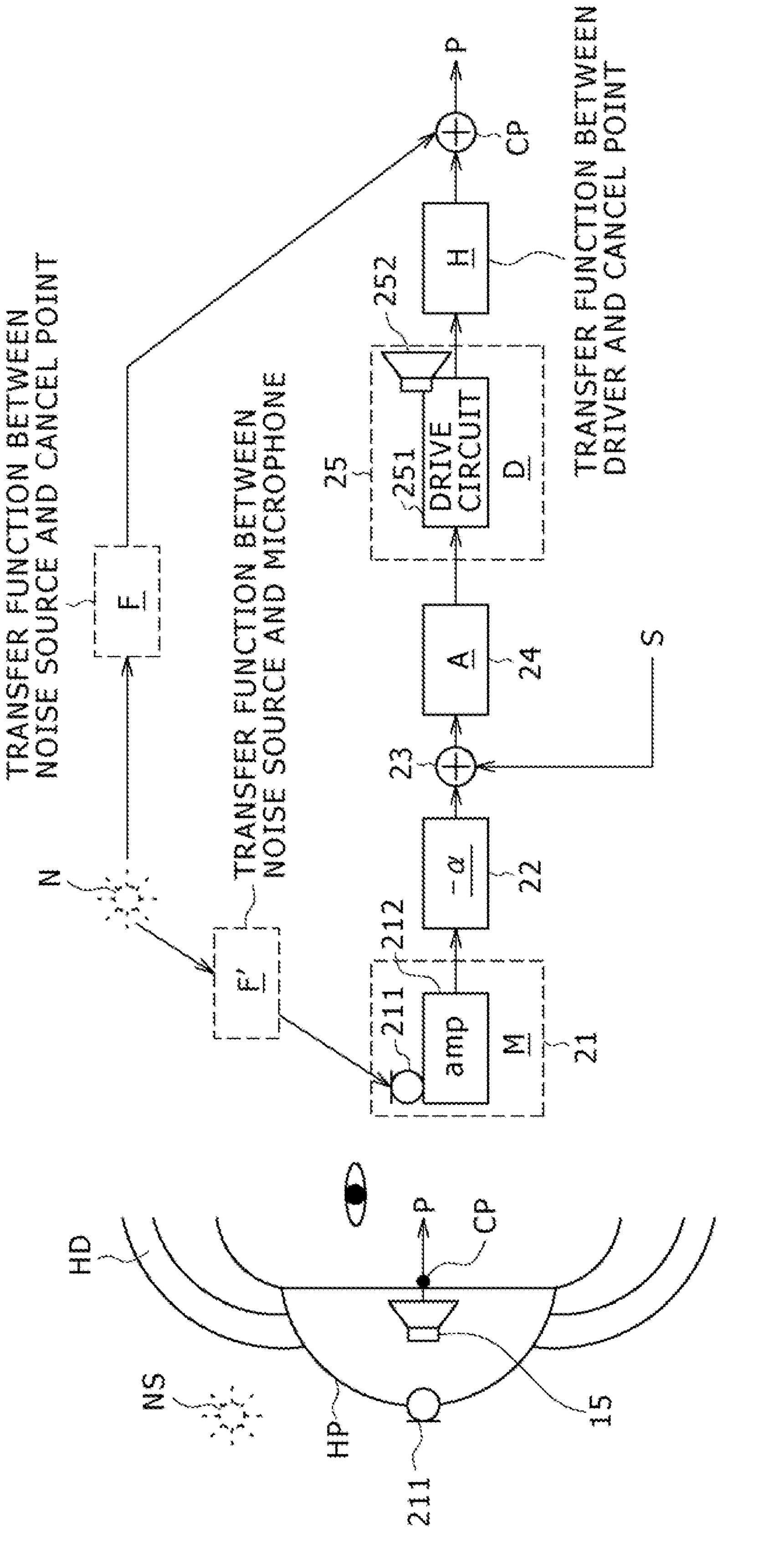
FIGS. 2A and 2B are a schematic view and a block diagram, respectively, showing a noise canceling system of the feedforward type.

Now, a noise canceling system of the feedforward type is described. FIG. 2A shows a configuration for the right channel side where a headphone system to which a noise canceling system of the feed forward type is applied is attached to the head of a user, that is, to a user head HD. Meanwhile, FIG. 2B shows a general configuration of the noise canceling system of the feedforward type.

In the noise canceling system of the feedforward type, a microphone 211 is basically disposed outside a headphone HP as seen in FIG. 2A. Then, noise collected by the microphone 211 is subjected to a suitable filtering process and then reproduced by a driver 25 provided inside the headphone housing HP so that the noise is canceled at a place proximate to the ear.

The noise canceling system of the feedforward type is described more particularly with reference to FIG. 2B. The noise canceling system of the feedforward type shown in FIG. 2B includes a microphone and microphone amplification section 21 including a microphone 211 and a microphone amplifier 212. The noise canceling system further includes a filter circuit (hereinafter referred to as FF filter circuit) 22 designed for feedforward control, a synthesis section 23, a power amplifier 24, and a driver 25 including a drive circuit 251 and a speaker 252.

Also in the noise canceling system of the feedforward type shown in FIG. 2B, the characters A, D and M described in blocks represent transfer functions of the power amplifier 24, driver 25 and microphone and microphone amplification section 21, respectively. Further, in FIG. 2, the character N represents an external noise source. The principal reason in entrance of noise into the headphone housing HP from the noise source N is such as described hereinabove in connection with the noise canceling system of the feedback type.

Further, in FIG. 2B, the transfer function from the position of the external noise N to the cancel point CP, that is, the transfer function between the noise source and the cancel point, is represented by the character F. Further, the transfer function from the noise source N to the microphone 211, that is, the transfer function between the noise source and the microphone, is represented by the character F'. Furthermore, the transfer function from the driver 25 to the cancel point (ear position) CP, that is, the transfer function between the driver and the cancel point, is represented by the character H.

Then, if the transfer function of the FF filter circuit 22 which makes the core of the noise canceling system of the feedforward type is represented by $-\alpha$, then the sound pressure or output sound P coming to the ear of the user in FIG. 2B can be represented by an expression (1) in FIG. 5.

Here, if ideal conditions are considered, then the transfer function F between the noise source and the cancel point can be presented by an expression (2) in FIG. 5. Then, if the expression (2) in FIG. 5 is substituted into the expression (1) in FIG. 5, then since the first term and the second term cancel each other, the sound pressure P in the noise canceling system of the feedforward type shown in FIG. 2B can be represented by an expression (3) in FIG. 5. From the expression (3), it can be recognized that the noise is canceled while only the music signal or the object sound signal or the like to be heard remains and sound similar to that in ordinary headphone operation can be enjoyed.

Actually, however, it is difficult to obtain a configuration of a complete filter having such transfer functions that the expression (2) illustrated in FIG. 5 is satisfied fully. Particularly in middle and high frequency regions, usually such an active noise reduction process as described above is not performed but passive sound interception by the headphone housing is applied frequently from such reasons that the individual differences are great in that the shape of the ear differs among different persons and the attaching state of a headphone differs among different persons and that the characteristics vary depending upon the position of noise and the position of the microphone. It is to be noted that the expression (2) in FIG. 5 signifies, as apparent from the expression itself, that the transfer function from the noise source to the ear position can be imitated by an electric circuit including the transfer function $\alpha$.

It is to be noted that, different from that in the noise canceling system of the feedback type, the cancel point CP in the noise canceling system of the feedforward type shown in FIGS. 2A and 2B can be set to an arbitrary ear position of the user as seen in FIG. 2A. However, in an ordinary case, the transfer function $\alpha$ is fixed and is determined aiming at some target characteristic in advance at a design stage. Therefore, there is the possibility that such a phenomenon may occur that, since the shape of the ear differs among different users, a sufficient noise cancel effect is not achieve or a noise component is added but not in an inverted phase, resulting in generation of abnormal sound.

From those, the noise canceling systems of the feedback type and the feedforward type generally have different characteristics in that, while the noise canceling system of the feedforward type is low in possibility of oscillation and hence is high in stability, it is difficult to obtain a sufficient attenuation amount whereas the noise canceling system of the feedforward type may require attention to stability of the system while a great attenuation amount can be expected.

A noise reduction headphone which uses an adaptive signal processing technique is proposed separately. In the case of a noise reduction headphone which uses the adaptive signal processing technique, a microphone is provided on both inside and outside a headphone housing. The inside microphone is used to analyze an error signal for cancellation with a filter processing component and produce and update a new adaptive filter. However, since noise outside of the headphone housing is basically processed by a digital filter and reproduced, the noise reduction headphone generally has a form of a feedforward system.

Noise Canceling System According to an Embodiment of the Invention

The noise canceling system according to an embodiment of the present invention has the advantages of both of the feedback system and the feedforward system described above.

In the embodiment of the present invention described below, both of a FF filter circuit 22 in the noise canceling system of the feedforward type and a FB filter circuit 12 in the noise canceling system of the feedback type have a configuration of a digital filter. The FF filter circuit 22 has a transmission function $-\alpha$ and therefore is hereinafter referred to sometimes as $\alpha$ circuit. Meanwhile, the FB filter circuit 12 has another transfer function $-\beta$ and therefore is hereinafter referred to sometimes as $\beta$ circuit.

FIGS. 6A, 6B and 6C are block diagrams showing the FF filter circuit 22, the FB filter circuit 12, and the FF and FB filter circuits 22 and 12 each configured as a digital filter, respectively. The FF filter circuit 22 of the noise canceling system of the feedforward type shown in FIG. 6A is interposed between the microphone amplifier 212 and the power amplifier 24 as seen in FIG. 2. Meanwhile, the FB filter circuit 12 of the noise canceling system of the feedback type shown in FIG. 6B is interposed between the microphone amplifier 112 and the power amplifier 14 as seen in FIG. 1.

Where any of the FF filter circuit 22 and the FB filter circuit 12 is configured as a digital filter, it can be formed from an ADC (Analog to Digital Converter) for converting an analog noise signal collected by the microphone into a digital noise signal, a DSP/CPU (Digital Signal Processor/Central Processing Unit) for performing arithmetic operation to form a noise reduction signal for reducing noise from the digital noise signal, and a DAC (Digital to Analog Converter) for converting the digital noise reduction signal from the DSP/CPU into an analog noise reduction signal. It is to be noted that the representation DSP/CPU in FIG. 6C signifies that one of a DSP and a CPU is used.

Where the FF filter circuit 22 or the FB filter circuit 12 is configured as a digital filter in this manner, (1) the system allows automatic selection or manual selection by a user among a plurality of modes, and this raises the performance in use as viewed from the user, and (2) since digital filtering which allows fine control is performed, control quality of a high degree of accuracy which exhibits minimized dispersion can be achieved, which results in increase of the noise reduction amount and the noise reduction frequency band.

Further, (3) since the filter shape can be changed by modification to software for an arithmetic operation processing device (digital signal processor (DSP)/central processing unit (CPU)) without changing the number of parts, alteration involved in change of the system design or device characteristics is facilitated. (4) Since the same ADC/DAC and DSP/CPU are used also for an external input such as music reproduction or telephone conversation, high sound quality reproduction can be anticipated by applying digital equalization of a high degree of accuracy also for such external input signals.

If the FF filter circuit 22 or the FB filter circuit 12 is formed in digitalized formation in this manner, then flexible control becomes possible for various cases, and a system can be configured which can cancel noise in high quality irrespective of a user who uses the system.

Problems of a Noise Canceling System of the Feedforward Type

Figure 7A:
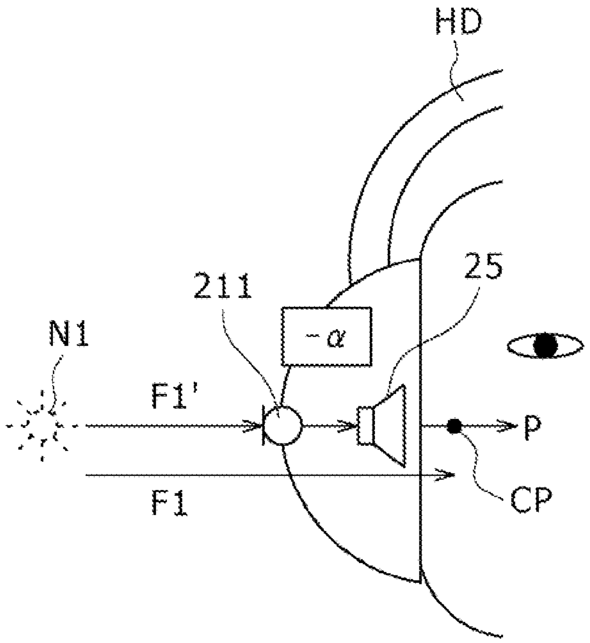
FIGS. 7A and 7B are schematic views illustrating a problem of the feedforward system.
Figure 7B:
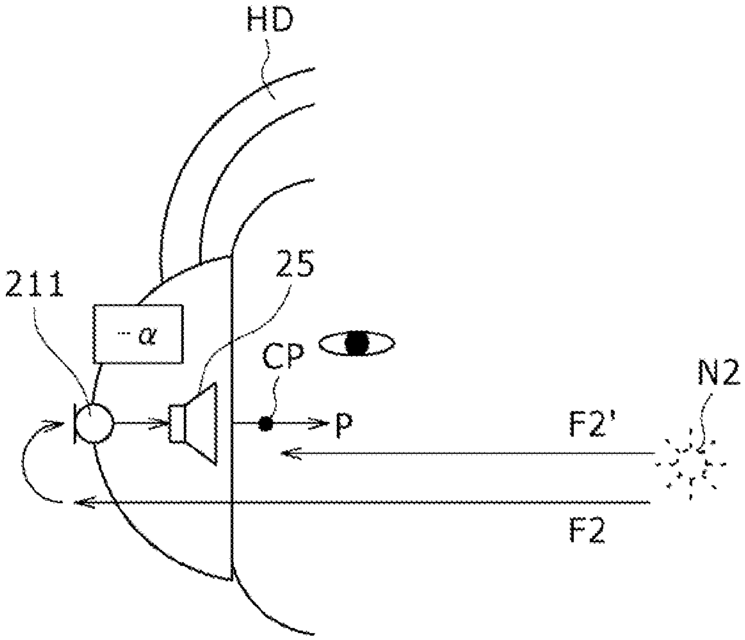

The feedforward system has a significant advantage of high stability as described hereinabove. However, it has an inherent problem. FIGS. 7A and 7B illustrate the problem of the feedforward system and show a configuration of the feedforward system on the right channel side where a headphone system to which the noise canceling system of the feedforward type is applied is attached to the user head HD of the user or hearing person.

Referring to FIG. 7A, the transfer function from a noise source N1 determined as a start point to a cancel point CP which is a target point of noise cancellation and is provided in the proximity of the auditory meatus on the inner side of the headphone housing is represented by F1. Meanwhile, the transfer function from the noise source N1 to the microphone 211 provided on the outer side of the housing of the headphone is represented by F1'.

At this time, sound collected by the microphone 211 provided on the outer side of the headphone housing is used to adjust the filter of the FF filter circuit ($\alpha$ circuit) 22. Then, the transfer function F1 to the cancel point CP is simulated with (F1'ADHM$\alpha$) as represented by the expression (3) in FIG. 5, and finally the sound is subtracted in the acoustic space in the inside of the headphone, resulting in reduction of noise. Here, the expression (3) in FIG. 5 is normally applied to a low frequency region while the phase is displaced in a high frequency region. Therefore, usually the gain of the FF filter circuit 22 is not taken, that is, no cancellation is performed.

Here, if it is assumed that the filter of the FF filter circuit 22 is fixed and the transfer characteristic $\alpha$ is optimized in such a noise positional relationship as seen in FIG. 7A while the position of the microphone used to collect noise is fixed and besides the single microphone is used, then the FF filter circuit 22 is not preferable in such a case that the noise source exists on the opposite side to the microphone 211 as indicated by a noise source N2 in FIG. 7B.

In particular, in the case of the example illustrated in FIG. 7B, sound waves of noise emitted from the noise source N2 first leak into the headphone housing through a gap between the headphone and the head of the user and makes disagreeable noise in the headphone housing. Thereafter, the sound waves come to the outside of the headphone and are collected by the microphone 211 whereafter they are subjected to particular filtering ($-\alpha$) by the FF filter circuit 22 and reproduced by the driver.

As can be recognized from comparison between FIGS. 7B and 7A, in the case of the arrangement of FIG. 7A, noise leaking in and a reproduction signal reproduced from the driver 25 arrive at the same time at the cancel point CP. Therefore, the frequency band within which the phases of the noise and the reproduction signal become reverse to each other is wide, and consequently, a fixed noise reduction effect is achieved. However, in the case of the arrangement of FIG. 7B, noise leaking into the inside of the headphone housing and noise arriving at the microphone 211 exist, and as a result, signals having an unexpected time difference therebetween are added to each other. Thus, particularly in middle and high frequency regions, the phases of the noise and the reproduction signal do not become reverse to each other, but the frequency band within which the phases are added as positive phases increases.

Accordingly, in the state illustrated in FIG. 6B, while the arrangement is intended for noise reduction, noise increases at a frequency at which the phases coincide with each other. At this time, even if great attenuation can be implemented over a wide frequency region, since the sense of hearing of a human being has an unfamiliar feeling for the fact that noise is generated even in a narrow frequency band. Therefore, the arrangement shown in FIG. 6B is not practical very much.

Naturally, this causes the situation to appear more likely as the frequency increases to a high frequency region in which the phase rotation is high. Accordingly, this makes a cause in narrowing the effective effect frequency band of noise cancellation, that is, the frequency band within which a gain of the α characteristic exists, in the FF filter circuit 22 of the noise canceling system of the feedforward type.

Noise Canceling System to which an Embodiment of the Invention is Applied

Therefore, the noise canceling system to which an embodiment of the present invention is applied has a basic configuration wherein a noise canceling system of the feedback type and a noise canceling system of the feedforward type are superposed on each other to form a single noise canceling system.

In particular, in the noise canceling system of the present embodiment described below, when it is in such a state as seen in FIG. 7A, noise canceling can be performed stably over a wide frequency band by the noise canceling system of the feedforward type. On the other hand, when the noise canceling system of the present embodiment is in such a state as seen in FIG. 7B, also noise leaking into the headphone housing can be canceled effectively by the noise canceling system of the feedback type.

First Working Example of the Noise Canceling System

Figure 8:
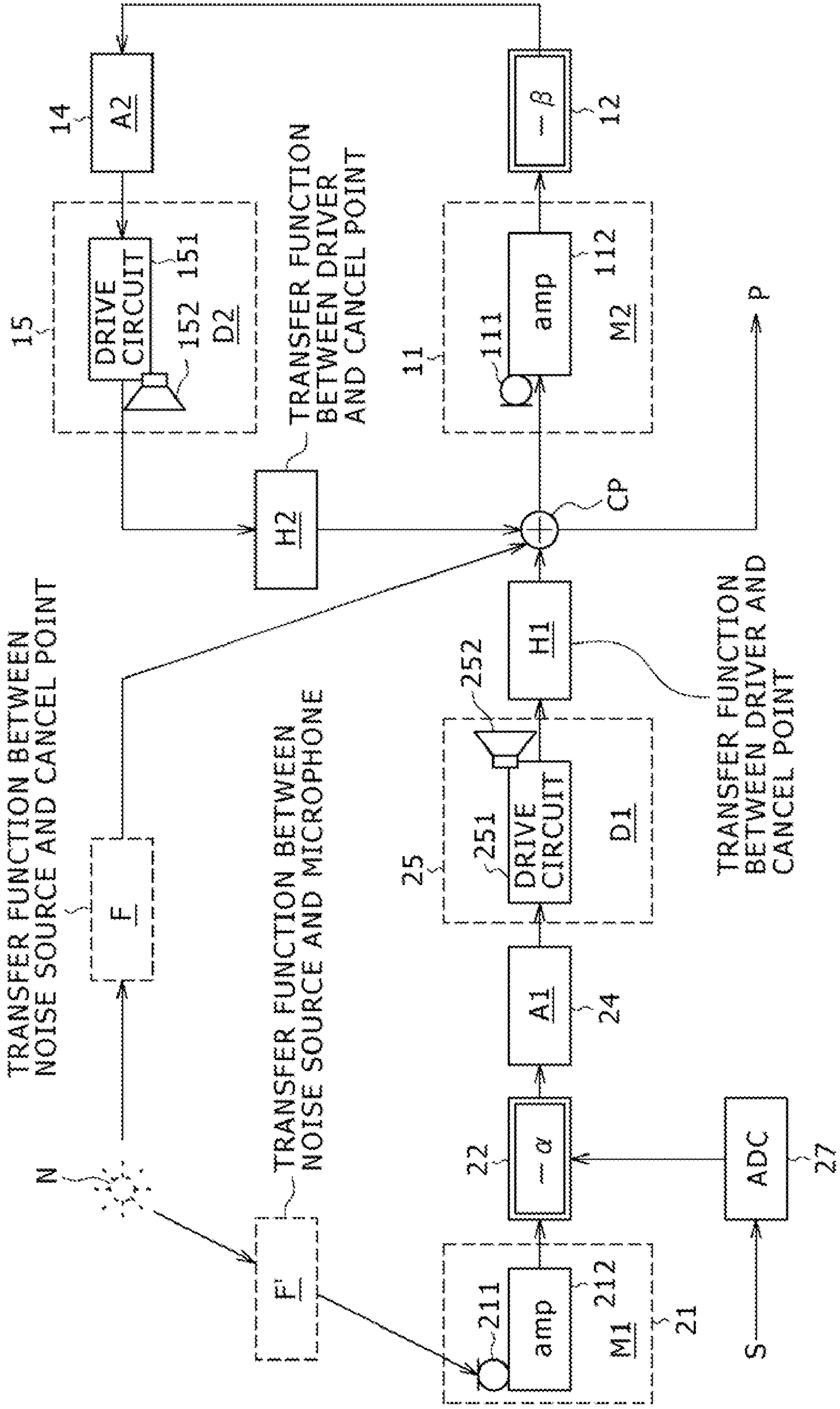
FIG. 8 is a block diagram showing a noise canceling system of the feedback type according to a first working example of the present invention.

A first working example of the noise canceling system to which the present invention is applied is shown in FIG. 8. Meanwhile, an FF filter circuit 22 and an FB filter circuit 12 shown in FIG. 8 are particularly shown in FIGS. 9A and 9B. Referring first to FIG. 8, the noise canceling system shown includes a noise canceling system of the feedback type shown at a right portion of FIG. 8 and a noise canceling system of the feedforward type shown at a left portion of FIG. 8.

Figure 9A:
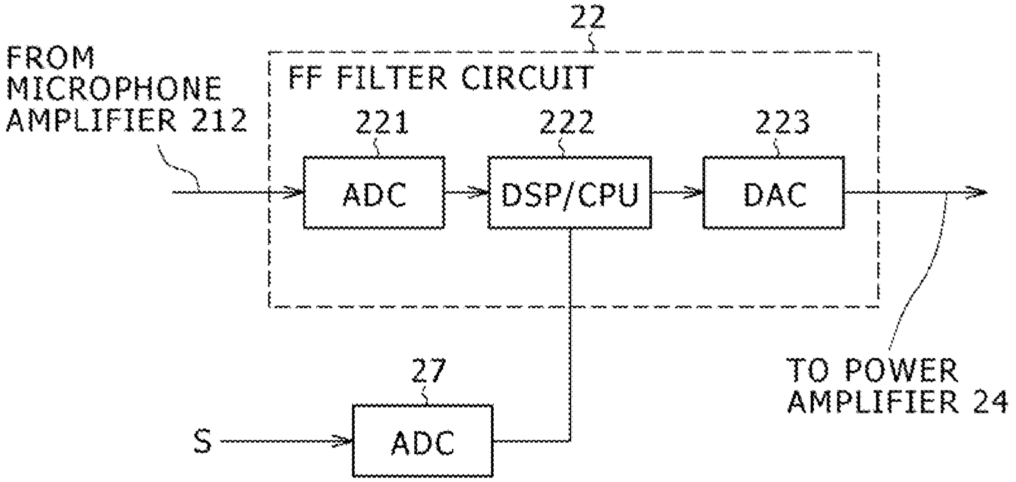
FIGS. 9A and 9B are block diagrams showing details of an FF filter circuit and an FB filter circuit shown in FIG. 8, respectively.

More particularly, the noise canceling system of the feedforward type in the noise canceling system shown in FIG. 8 includes a microphone and microphone amplification section 21 which in turn includes a microphone 211 and a microphone amplifier 212, an FF filter circuit (α circuit) 22, a power amplifier 24, and a driver 25. The FF filter circuit 22 has a configuration of a digital filter formed from an ADC 221, a DSP/CPU section 222 and a DAC 223 as seen in FIG. 9A.

An ADC 27 accepts input sound in the form of an analog signal, for example, from an external music reproduction apparatus, a microphone of a hearing aid or the like, converts the input sound into a digital signal and supplies the digital signal to the DSP/CPU section 222. Consequently, the DSP/CPU section 222 can add a noise reduction signal for reducing noise to the input sound supplied thereto from the outside.

It is to be noted that, in the noise canceling system section of the feedforward type shown in FIG. 8, the transfer function of the microphone and microphone amplification section 21 is represented by "M1," the transfer function of the FF filter circuit 22 by "−α," the transfer function of the power amplifier 24 by "A1," and the transfer function of the driver 25 by "D1." Further, in the noise canceling system section of the feedforward type, the transfer function "H1" between the driver and the cancel point, the transfer function "F" between the noise source and the cancel point and the transfer function "F'" between the noise source and the microphone can be taken into consideration.

Figure 9B:
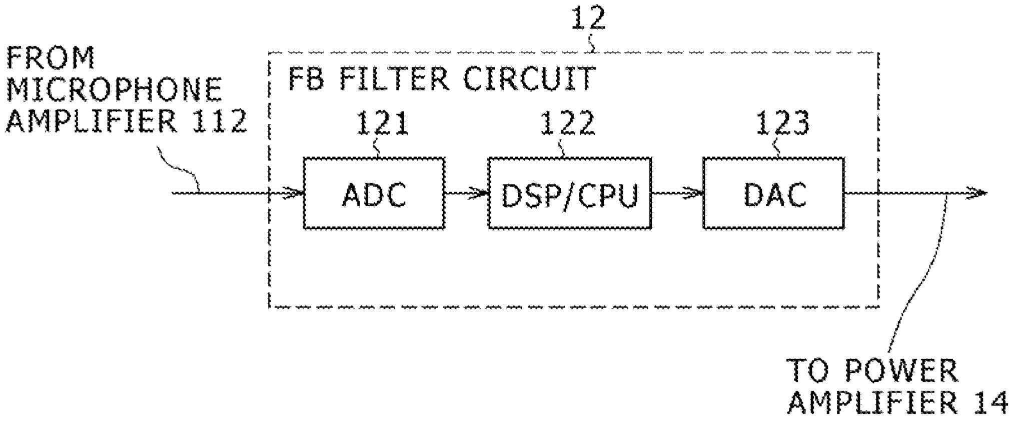

Meanwhile, the noise canceling system section of the feedback type of the noise canceling system shown in FIG. 8 includes a microphone and microphone amplification section 11 which in turn includes a microphone 111 and a microphone amplifier 112, an FB filter circuit (β circuit) 12, a power amplifier 14, and a driver 15 which in turn includes a drive circuit 151 and a speaker 152. The FB filter circuit 12 has a configuration of a digital filter including an ADC 121, a DSP/CPU section 122 and a DAC 123 as seen in FIG. 9B.

It is to be noted that, in the noise canceling system section of the feedback type shown in FIG. 8, the transfer function of the microphone and microphone amplification section 11 is represented by "M2," the transfer function of the FB filter circuit 12 by "−β," the transfer function of the power amplifier 14 by "A2," and the transfer function of the driver 15 by "D2." Further, in the noise canceling system section of the feedback type, the transfer function "H2" between the driver and the cancel point can be taken into consideration.

In the noise canceling system of the configuration shown in FIG. 8, external noise is fetched and canceled by the noise canceling system section of the feedforward type. However, by a sound source of noise sound and natures of sound waves of the sound source (for example, by a behavior of sound waves like that of spherical waves or plane waves), while a frequency band within which noise is reduced in the inside of the headphone housing is obtained as described above, actually it is hard to efficiently cancel noise, and as a result, a frequency band within which noise remains may appear. A similar problem occurs also from an attached state of the headphone or the shape of the ear of the individual.

However, in the case of the noise canceling system having the configuration shown in FIG. 8, noise components remaining in the noise canceling system section of the feedforward type and noise components entering the inside of the headphone housing can be canceled efficiency by action of the noise canceling system section of the feedback type. In other words, as the noise canceling system section of the feedforward type and the noise canceling system of the feedback type are rendered operative at the same time, a noise canceling effect or noise reduction effect higher than that which is achieved when each of the noise canceling systems of the feedforward type and the feedback type is used solely is achieved.

In this manner, in the noise canceling system shown in FIG. 8, noise leaking into the inside of the headphone housing can be canceled appropriately at the cancel point CP by the noise canceling system section of the feedback type shown at a right portion of FIG. 8 while noise from the noise source N outside the headphone housing can be canceled appropriately at the cancel point CP by the noise canceling system section of the feedforward type shown at a left portion of FIG. 8.

It is to be noted that each of the noise canceling system section of the feedforward type and the noise canceling system of the feedback type in the noise canceling system shown in FIG. 8 separately includes a microphone and microphone amplification section, a power amplifier and a driver.

Figure 10:
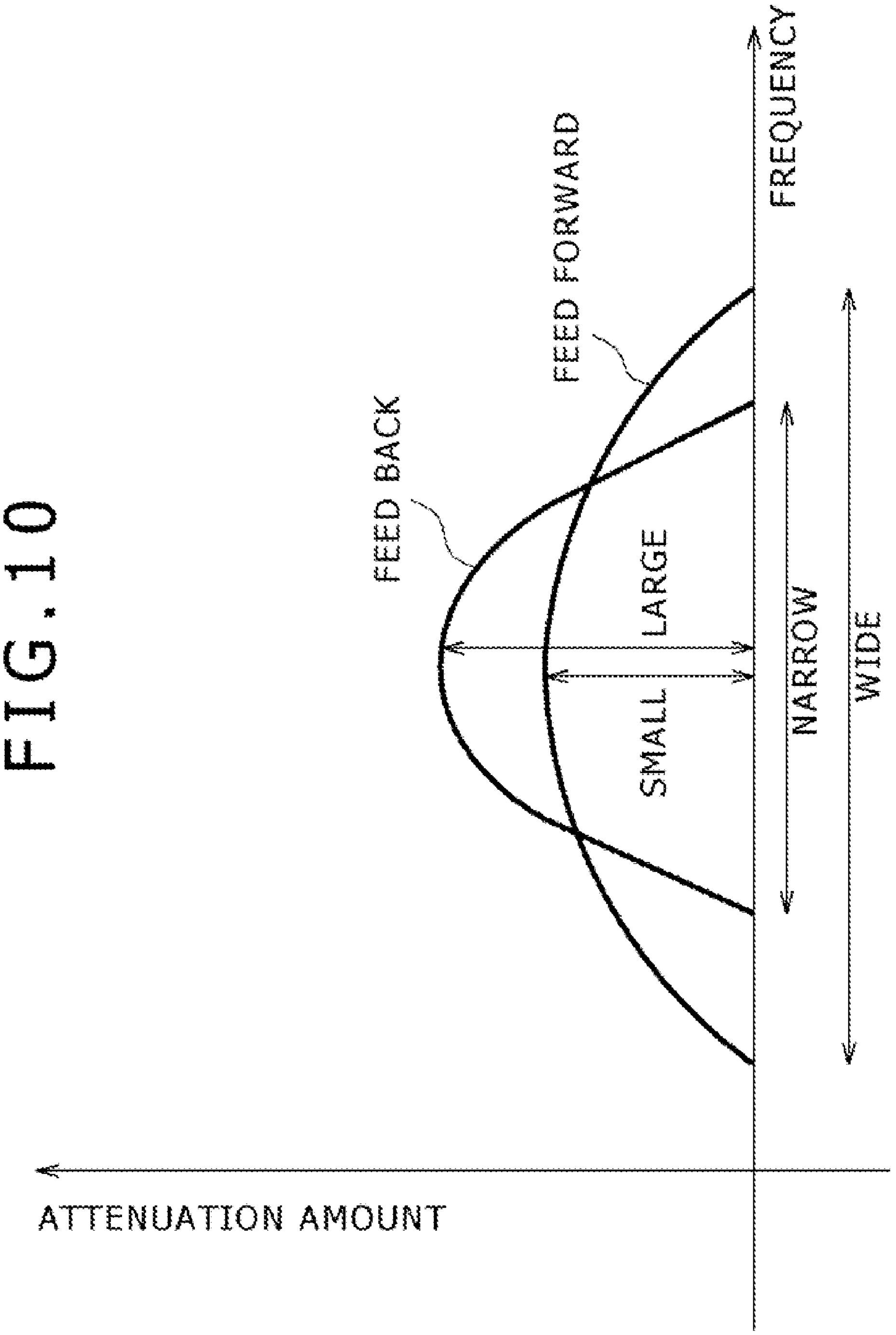
FIG. 10 is a diagram illustrating a general difference between attenuation characteristics of noise canceling systems of the feedback type and the feedforward type.

FIG. 10 illustrates a general difference in attenuation characteristic between the noise canceling system of the feedback type and the noise canceling system of the feedforward type. Referring to FIG. 10, the axis of abscissa indicates the frequency, and the axis of ordinate indicates the attenuation amount. Further, as seen in FIG. 10, while the attenuation characteristic of the noise canceling system of the feedback type has features of a narrow frequency band and a high level, the attenuation characteristic of the noise canceling system of the feedforward type has features of a wide frequency band and a low level as described above.

However, the noise canceling system shown in FIG. 8 is considered to be a noise canceling system of, as it were, a twin type which includes a noise canceling system section of the feedforward type and a noise canceling system of the feedback type. The noise canceling system of the twin type has a composite attenuation characteristic formed from the characteristics illustrated in FIG. 10 of the noise canceling system of the feedforward type and the noise canceling system of the feedback type.

Figure 11:
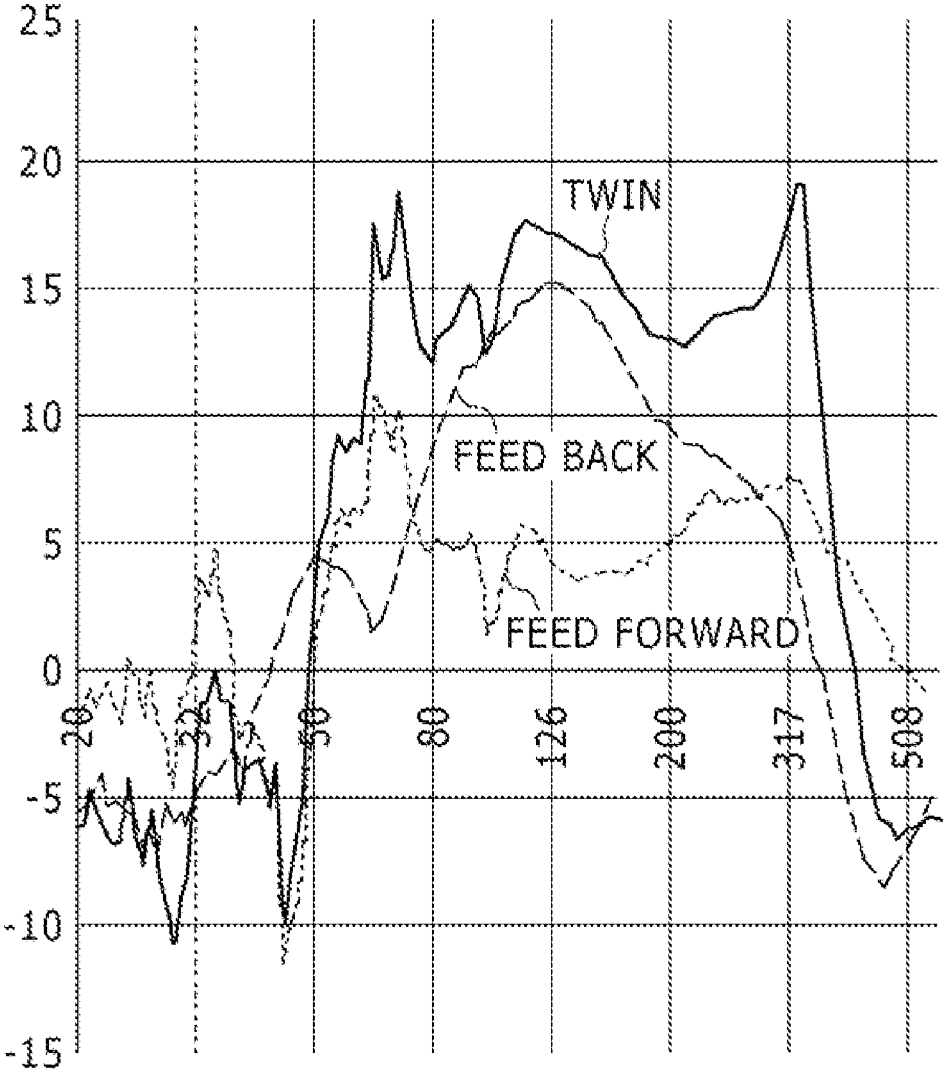
FIG. 11 is a diagram illustrating an attenuation characteristic of a noise canceling system of the twin type having the configuration shown in FIG. 8.

FIG. 11 illustrates actual measurement values of the attenuation characteristic where the noise canceling system of the twin type having the configuration shown in FIG. 8, actual measurement values of the attenuation characteristic where the noise canceling system of the feedback type is used and actual measurement values of the attenuation characteristic where the noise canceling system of the feedforward type is used.

Referring to FIG. 11, the axis of abscissa indicates the frequency, and the axis of ordinate indicates the attenuation amount. Further, a graph indicated by a rough broken line and having characters "Feed Back" annexed thereto indicates the attenuation characteristic of the noise canceling system of the feedback type. Meanwhile, another graph indicated by a fine broken line and having characters "Feed Forward" annexed thereto indicates the attenuation characteristic of the noise canceling system of the feedforward type. A further graph indicated by a solid line and having characters "Twin" annexed thereto indicates the attenuation characteristic of the noise canceling system of the twin type having the configuration shown in FIG. 8.

As can be recognized from FIG. 11, the noise canceling system of the feedback type has an attenuation characteristic of a narrow frequency band and a high level while the noise canceling system of the feedforward type has another attenuation characteristic of a wide frequency band and a low level. Further, it can be recognized that the noise canceling system of the twin type has an attenuation characteristic which exhibits a high level over a wide frequency range.

In this manner, the noise canceling system of the twin type having the configuration shown in FIG. 8 has both of attenuation characteristics of the feedback system and the feedforward system and can implement an attenuation characteristic of a wide frequency band and a high level.

Second Working Example of the Noise Canceling System

Figure 12:
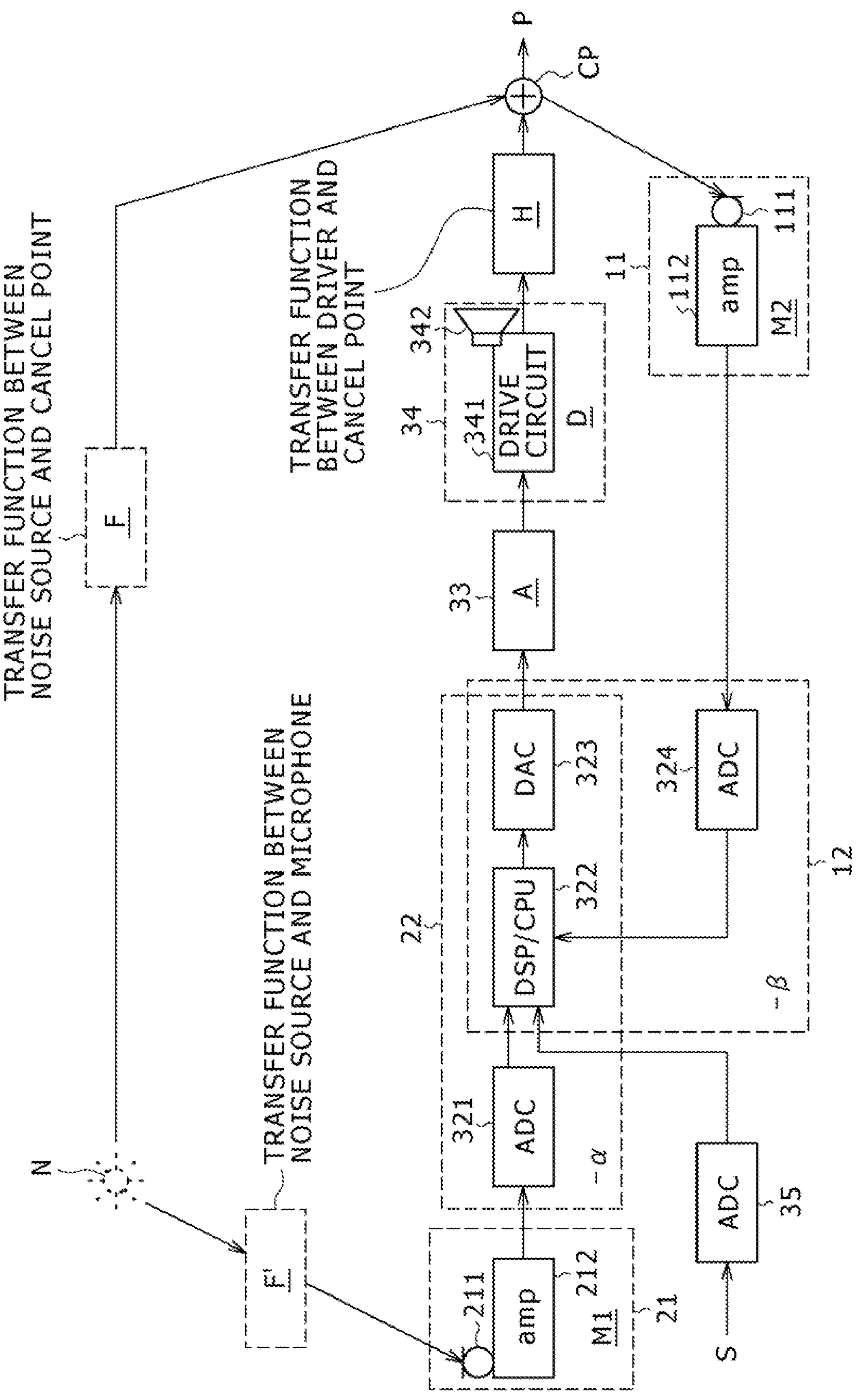
FIG. 12 is a block diagram showing a noise canceling system of the feedback type according to a second working example of the present invention.

FIG. 12 shows a second working example of the noise canceling system to which the present invention is applied. Referring to FIG. 12, the second working example of the noise canceling system shown includes a noise canceling system section of the feedforward type which in turn includes a microphone and microphone amplification section 21 which in turn includes a microphone 211 and a microphone amplifier 212. The noise canceling system section of the feedforward type further includes an FF filter circuit 22 which is formed from an ADC 321, a DSP/CPU section 322 and a DAC 323, a power amplifier 33, and a driver 34 which in turn includes a drive circuit 341 and a speaker 342.

The second example of the noise canceling system shown in FIG. 12 further includes a noise canceling system section of the feedback type which in turn includes a microphone and microphone amplification section 11 which in turn includes a microphone 111 and a microphone amplifier 112. The noise canceling system section of the feedback type further includes an FB filter circuit 12 which is formed from an ADC 324, the DSP/CPU section 322 and the DAC 323, the power amplifier 33, and the driver 34 which is formed from the drive circuit 341 and the speaker 342.

In particular, while the noise canceling system according to the first working example shown in FIG. 8 has a configuration wherein the noise canceling system section of the feedback type and the noise canceling system of the feedforward type are formed separately from each other and connected to each other, the second example of the noise canceling system shown in FIG. 12 is configured such that the noise canceling systems of the feedback type and the feedforward type commonly use the DSP/CPU section 322, DAC 323, power amplifier 33 and driver 34.

Further, in the second example of the noise canceling system shown in FIG. 12, the transfer function of the microphone and microphone amplification section 21 is represented by "M1," the transfer function of the FF filter circuit 22 by "−α," the transfer function of the power amplifier 33 by "A," and the transfer function of the driver 34 by "D." Further, the transfer function of the microphone and microphone amplification section 11 is represented by "M2" and the transfer function of the FB filter circuit 12 by "−β."

Also in the noise canceling system according to the second working example shown in FIG. 12, the transfer function "H" between the driver and the cancel point, the transfer function "F" between the noise source and the cancel point, and the transfer function "F'" between the noise source and the microphone can be taken into consideration.

Further, also in the second working example shown in FIG. 12, input sound is supplied through an ADC 35 to the DSP/CPU section 322, by which it can be added to a noise reduction signal.

Accordingly, in the noise canceling system according to the second working example shown in FIG. 12, the DSP/CPU section 322 can perform a process of forming a noise reduction signal based on sound collected by the microphone 211 on the outer side of the headphone housing and forming another reduction signal based on sound collected by the microphone 111 on the inner side of the headphone housing and then synthesizing the thus formed noise reduction signals.

In this manner, in the case of the noise canceling system according to the second working example shown in FIG. 12, since it includes those elements which are common between the noise canceling system section of the feedback type and the noise canceling system section of the feedforward type, the number of parts can be reduced and the configuration can be simplified.

Further, according to the noise canceling system of the twin type, an attenuation characteristic of a wide frequency band and a high level can be implemented by causing the noise canceling system section of the feedforward type formed from the microphone and microphone amplification section 21, FF filter circuit 22, power amplifier 33 and driver 34 and the noise canceling system section of the feedback type formed from the microphone and microphone amplification section 11, FB filter circuit 12, power amplifier 33 and driver 34 to function simultaneously as described hereinabove.

Third Working Example of the Noise Canceling System

Incidentally, in the noise canceling system of the twin type shown in FIG. 8 or 12, where a hearing person hears an external source such as a music signal from a music reproduction apparatus or a sound signal collected by a microphone of a hearing aid as indicated by input sound S, since such sound or music is heard, the reduction amount of noise may possibly be very great. In contrast, although an external source need not be heard, sound may be reduced to form a no-sound state of a high degree of quality. For example, where a hearing person has to work under extreme noise, it is demanded strongly to reduce the noise with a high degree of quality.

Therefore, while the noise canceling system according to the third working example is a noise canceling system of the twin type which has both of a noise canceling system section of the feedback type and another noise canceling system of the feedforward type, it allows selective functioning of the noise canceling system sections. In particular, when an external source is to be heard, only one of the noise canceling system section of the feedback type and the noise canceling system section of the feedforward type is caused to function. However, when there is no necessity to hear an external source but a no-sound state of a high degree of quality (minimized-sound state) is to be formed, both of the noise canceling system section of the feedback type and the noise canceling system section of the feedforward type are caused to function.

Figure 13:
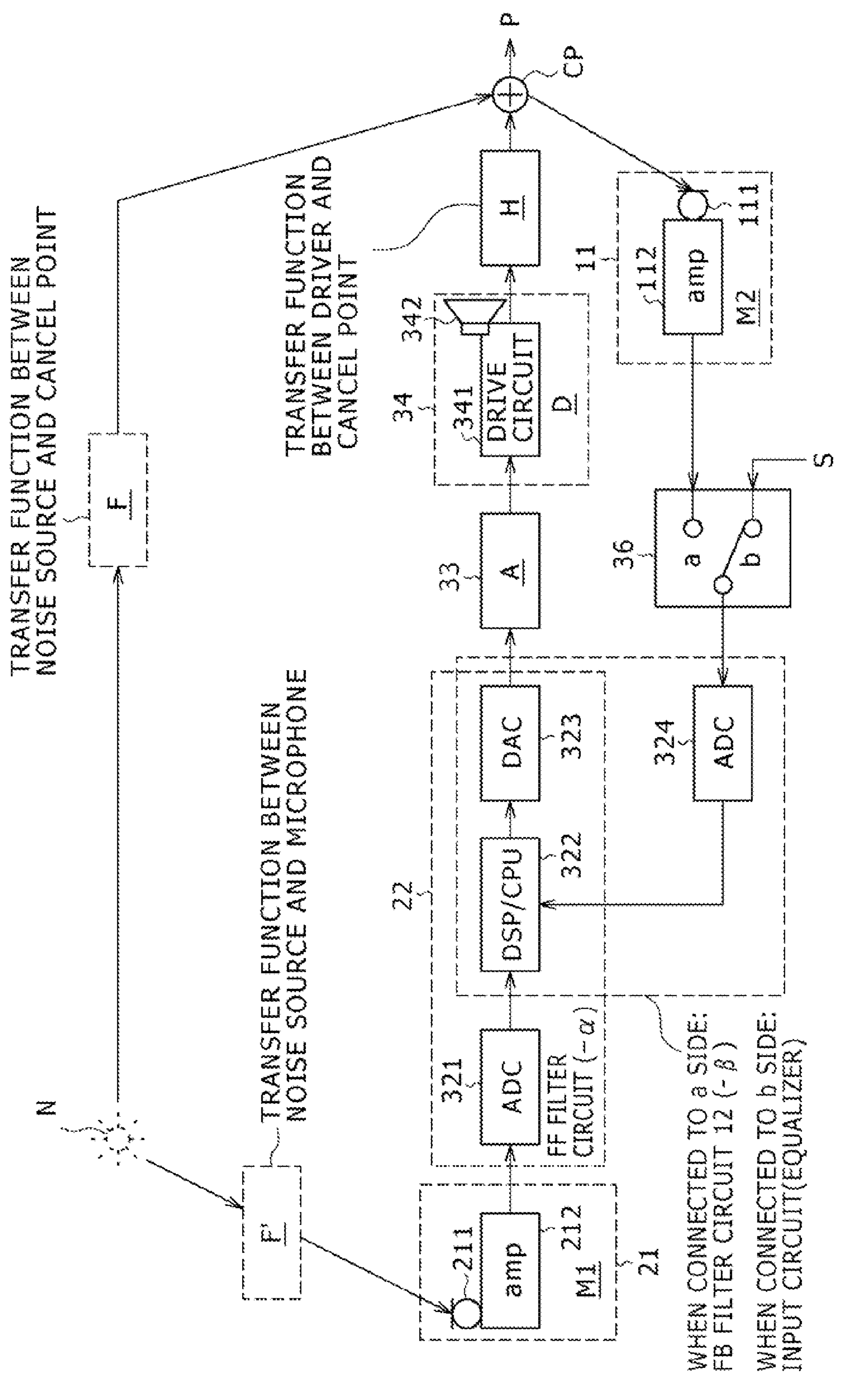
FIGS. 13 and 14 are block diagrams showing a noise canceling system of the feedback type according to a third working example of the present invention.
Figure 14:
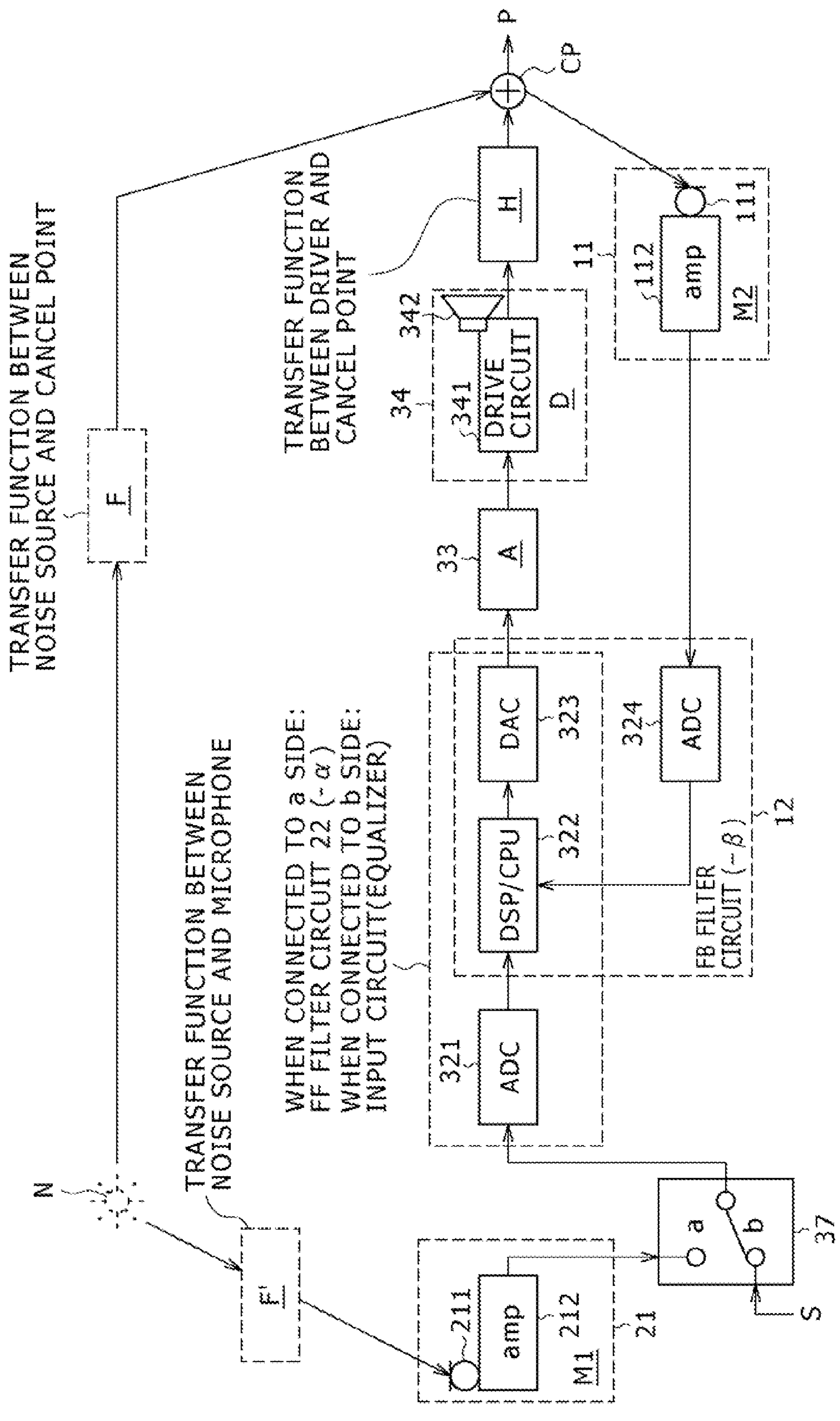

FIGS. 13 and 14 show the noise canceling systems according to the third working example. The noise canceling systems according to the third working example shown in FIGS. 13 and 14 have a basic configuration similar to that of the noise canceling system according to the second working example shown in FIG. 12. Thus, description of common components of the noise canceling systems according to the third working example shown in FIGS. 13 and 14 to those of the noise canceling system according to the second working example shown in FIG. 12 is omitted herein to avoid redundancy.

The noise canceling system according to the third working example shown in FIG. 13 is configured such that the noise canceling system according to the second working example shown in FIG. 12 additionally includes a switch circuit 36 interposed between the microphone and microphone amplification section 11 and the ADC 324. Consequently, in the noise canceling system according to the third working example shown in FIG. 13, the switch circuit 36 can be used for changeover between a state wherein a sound signal from the microphone and microphone amplification section 11 is supplied to the ADC 324 and another state wherein an input sound S as an external source supplied from the outside is supplied to the ADC 324.

Accordingly, in the noise canceling system according to the third working example shown in FIG. 13, if the switch circuit 36 is switched to an input terminal a side, then the input sound S is not supplied and the FB filter circuit 12 and the FF filter circuit 22 function so that both of the noise canceling system section of the feedback type and the noise canceling system section of the feedforward type function to form a no-sound state of a high degree of quality.

On the other hand, if the switch circuit 36 is switched to another input terminal b side, then sound from the FF filter circuit 22 is not supplied and the ADC 324, DSP/CPU section 322 and DAC 323 function as an input circuit "equalizer" for the input sound S. Then, in this instance, the FF filter circuit 22 functions, and consequently, only the noise canceling system section of the feedforward type functions. Consequently, while noise is canceled, the hearing person can hear the input sound S.

Accordingly, in this instance, the ADC 321, DSP/CPU section 322 and DAC 323 implement the function of the FF filter circuit 22, and the ADC 324, DSP/CPU section 322 and DAC 323 implement the function of an equalizer for the input sound S. In other words, the DSP/CPU section 322 and the DAC 323 have both of the function of an FF filter circuit and the function of an equalizer for processing the input sound S.

Meanwhile, the noise canceling system according to the third working example shown in FIG. 14 is configured such that the noise canceling system according to the third working example shown in FIG. 12 additionally includes a switch circuit 37 interposed between the microphone and microphone amplification section 21 and the ADC 321. Consequently, in the noise canceling system according to the third working example shown in FIG. 14, the switch circuit 37 can be used for changeover between a state wherein a sound signal from the microphone and microphone amplification section 21 is supplied to the ADC 321 and another state wherein input sound S as an external source supplied from the outside is supplied to the ADC 321.

Accordingly, in the noise canceling system of the third example shown in FIG. 14, if the switch circuit 37 is switched to an input terminal a side, then the input sound S is not supplied and the FF filter circuit 22 and the FB filter circuit 12 function so that both of the noise canceling system section of the feedforward type and the noise canceling system section of the feedback type function to form a no-sound state of a high degree of quality.

On the other hand, if the switch circuit 37 is switched to another input terminal b side, then sound from the microphone and microphone amplification section 21 is not supplied and the ADC 321, DSP/CPU section 322 and DAC 323 function as an input circuit "equalizer" for the input sound S. Then, in this instance, the FB filter circuit 12 functions, and consequently, only the noise canceling system section of the feedback type functions. Consequently, while noise is canceled, the hearing person can hear the input sound S.

Accordingly, in this instance, the ADC 324, DSP/CPU section 322 and DAC 323 implement the function of the FB filter circuit 12, and the ADC 321, DSP/CPU section 322 and DAC 323 implement the function of an equalizer for the input sound S. In other words, the DSP/CPU section 322 and the DAC 323 have both of the function of an FB filter circuit and the function of an equalizer for processing the input sound S.

In this manner, in the noise canceling systems according to the third working example described above with reference to FIGS. 13 and 14, where the input sound S of an external source is to be heard, only one of the noise canceling system section of the feedforward type and the noise canceling system section of the feedback type is caused to function so that, while noise is canceled or reduced, the hearing person can hear the input sound favorably.

Further, under such a situation that the hearing person wants to hear a no-sound state, both of the noise canceling system section of the feedforward type and the noise canceling system section of the feedback type are used to cancel both of noise from the external world and noise self-generated by phase nonconformity to form a no-sound state of a high degree of quality. Consequently, the hearing person can bodily feel a sensation of a high noise reduction effect.

It is to be noted that the noise canceling system according to the third working example shown in FIG. 13 is configured such that, when input sound S is to be reproduced, only the noise canceling system section of the feedforward type functions whereas the noise canceling system of the third example shown in FIG. 14 is configured such that only the noise canceling system section of the feedback type functions. However, the changeover between the noise canceling system sections is not limited to this, but otherwise it is possible to configure the noise canceling system such that the hearing person can perform changeover between whether the noise canceling system section of the feedforward type should function or whether the noise canceling system section of the feedback type should function.

In particular, it is possible to combine the noise canceling systems according to the third working example shown in FIGS. 13 and 14 such that both of the switch circuit 36 and the switch circuit 37 are provided. Further, a switch circuit 38 is provided for changing over between whether input sound S should be supplied to the switch circuit 36 or to the switch circuit 37.

Then, if the newly provided switch circuit 38 is switched so that the input sound S is supplied to the switch circuit 36, then the switch circuit 36 is switched to the input terminal b side while the switch circuit 37 is switched to the input terminal a side so as to cause only the noise canceling system section of the feedforward type to function so that the hearing person can hear the input sound S.

On the contrary, if the newly provided switch circuit 38 is switched so that the input sound S is supplied to the switch circuit 37, then the switch circuit 37 is switched to the input terminal b side while the switch circuit 36 is switched to the input terminal a side so as to cause only the noise canceling system section of the feedback type to function so that the hearing person can hear the input sound S.

Naturally, also in this instance, when the hearing person wants to form a no-sound state of a high degree of quality, both of the switch circuit 36 and the switch circuit 37 are switched to the input terminal a side. Consequently, both of the noise canceling system section of the feedback type and the noise canceling system section of the feedforward type function to form a no-sound state of a high degree of quality.

It is to be noted that any of the switch circuits 36, 37 and 38 described above may be formed as a mechanical switch or as an electric switch.

Further, while it is described above that the noise canceling systems shown in FIGS. 8, 12, 13 and 14 can accept supply of input sound S of an external source, they are not limited to those of the type just described. Also it is possible to form any of the noise canceling systems described as a noise canceling system merely for noise reproduction which does not have an input section for accepting the input sound S from the outside.

Particular Examples of Digitalized Formation of the FB Filter Circuit 12 and the FF Filter Circuit 22

Where the FB filter circuit 12 and the FF filter circuit 22 are formed in digitalized formation, each of them is formed from an ADC, a DSP/CPU section and a DAC as described hereinabove with reference to FIGS. 6C and 9. In this instance, if, for example, an ADC and a DAC which are of the sequential conversion type and can perform high speed conversion are used for the ADC and the DAC, then a noise reduction signal can be produced at an appropriate timing thereby to implement reduction of noise.

However, an ADC and a DAC of the sequential conversion type which can perform high speed conversion are so expensive that a high cost is demanded for the FB filter circuit 12 and the FF filter circuit 22. Therefore, a technique for making it possible to produce a noise reduction signal at a suitable timing without generating a great amount of delay even where an ADC or a DAC of the sigma-delta (Σ-Δ) type which are used in the past is used is described. It is to be noted that, in order to simplify the description, the following description is given taking a case wherein the technique is applied to the FB filter circuit 12 as an example. However, the technique can be applied similarly also to the FF filter circuit 22.

Figures 15A, 15B:
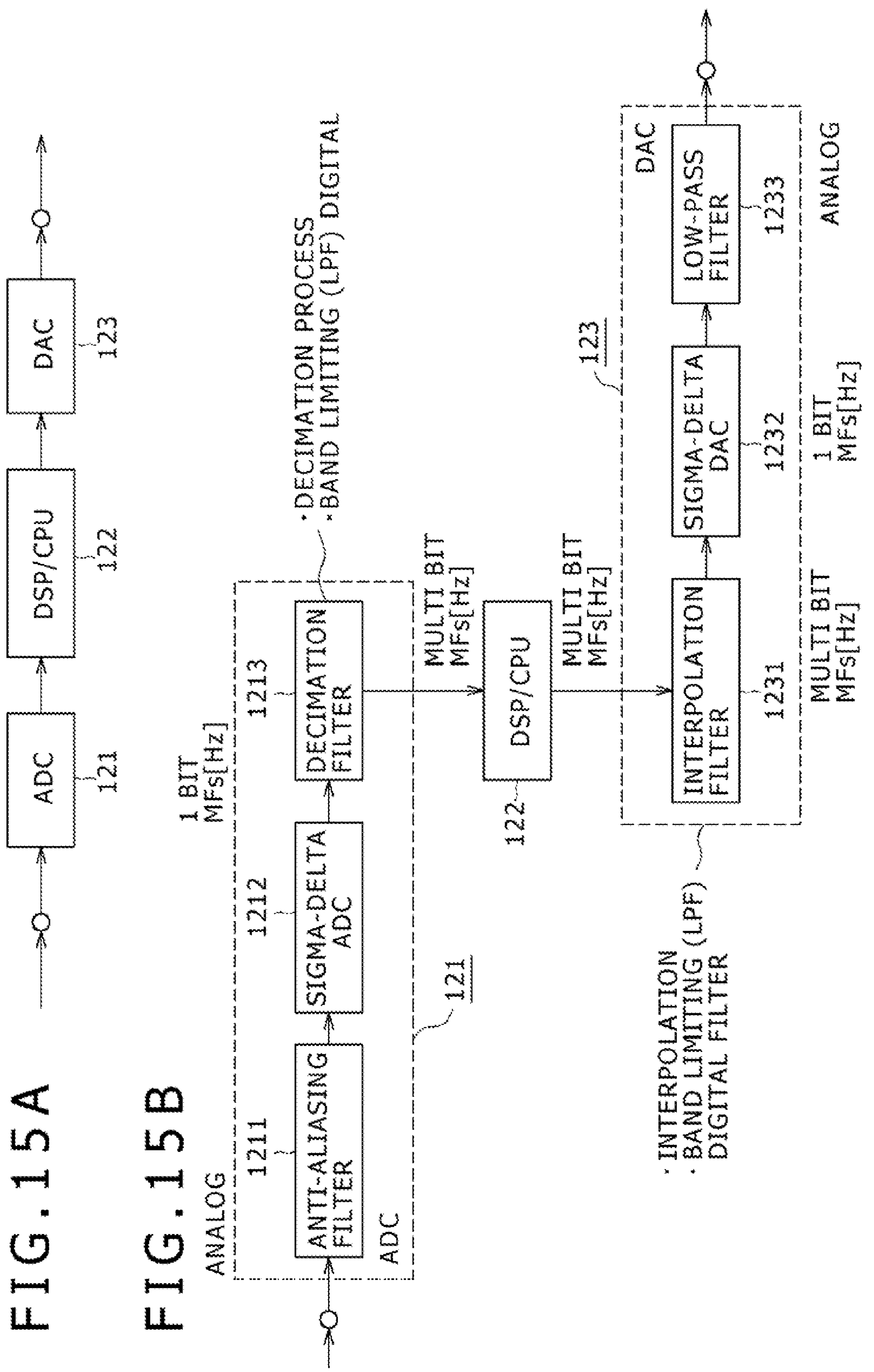
FIGS. 15A and 15B are block diagrams showing a configuration an FB filter circuit and particularly showing a configuration of an ADC and a DAC.

FIGS. 15A and 15B show a configuration of the FB filter circuit 12, particularly a configuration of the ADC 121 and the DAC 123. As seen in FIGS. 6C and 15A, the FB filter circuit 12 includes an ADC 121, a DSP/CPU section 122 and a DAC 123. As seen in FIG. 15B, the ADC 121 includes an anti-aliasing filter 1211, a sigma-delta ADC section (Σ-Δ) 1212, and a decimation filter 1213. Meanwhile, the DAC 123 includes an interpolation filter 1231, a sigma-delta DAC section (Σ-Δ) 1232, and a low-pass filter 1233.

Generally, both of the ADC 121 and the DAC 123 use an oversampling method and sigma-delta modulation in which a 1-bit signal is used. For example, where an analog input is subjected to a digital signal process by the DSP/CPU section 122, it is converted into 1 Fs/multi-bits (in most cases, 6 bits to 24 bits). However, according to the Z-A method, the sampling frequency Fs [Hz] is in most cases raised to MFs [Hz] of M times to perform oversampling.

As seen in FIG. 15B, the anti-aliasing filter 1211 provided at the entrance of the ADC 121 and the low-pass filter 1233 provided at the exist portion of the DAC 123 prevent a signal in a frequency band higher than ½ the sampling frequency Fs from being inputted and outputted. Actually, however, since the anti-aliasing filter 1211 and the low-pass filter 1233 are both formed from an analog filter, it is difficult to obtain an attenuation characteristic which is steep in the proximity of Fs/2.

As seen in FIG. 15B, the decimation filter 1213 is included in the ADC side while the interpolation filter 1231 is included in the DAC side, and those filters are used to perform a decimation process and an interpolation process. Simultaneously, a steep digital filter of a high order number is used to apply band limitation in the inside of each of the filters thereby to decrease the burden on the anti-aliasing filter 1211 which accepts an analog signal and also on the low-pass filter 1233 which outputs an analog signal.

Incidentally, delay which occurs in the ADC 121 and the DAC 123 is generated almost by the high-order digital filters in the decimation filter 1213 and the interpolation filter 1231. In particular, since a filter having a high order number (in the case of a finite impulse response (FIR) filter, a filter having a great tap number) is used in a region having a sampling frequency of MFs Hz in order to obtain a steep characteristic around Fs/2, group delay occurs after all.

In this digital filter section, in order to avoid a bad influence of deterioration of the time waveform by phase distortion, an FIR filter having a linear phase characteristic is used. Especially, there is a tendency to favorably use an FIR filter based on a moving average filter which can implement an interpolation characteristic by a SINC function (sin(x)/x). It is to be noted that, in the case of a filter of the linear phase type, the time of one half the filter length almost makes a delay amount.

An FIR filter can represent a characteristic whose steepness and attenuation effect naturally increase as the order number (tap number) increases. Since a filter having a small order number is not generally used very much because it does not provide a sufficient attenuation amount (provides much leakage) and is influenced much by aliasing. However, where a filter of a small order number is used in the noise canceling system of the feedback type, the delay time can be reduced because use of an FIR filter which satisfies such conditions as hereinafter described becomes possible.

If the delay time decreases, then the phase rotation decreases. As a result, when the FB filter circuit 12 is designed so as to produce such composite open loop characteristics as described hereinabove with reference to FIG. 4, the band whose characteristic is higher than 0 dB can be expanded, and a significant effect is achieved in a frequency band and an attenuation characteristic thereof by the noise canceling system. In addition, it can be imagined readily that also the degree of freedom upon production of a filter increases.

Thus, in FIG. 15B, for the FIR filter which forms the decimation filter 1213 and the interpolation filter 1231 both in the form of a digital filter, (1) an FIR filter which exhibits attenuation of equal to or more than −60 dB over a frequency band from approximately (Fs−4 kHz) to (Fs+4 kHz) where Fs is the sampling frequency should be used.

In this instance, (2) a sampling frequency Fs equal to or higher than twice (approximately 40 kHz) the audible range should be used, and (3) the sigma-delta (Σ-Δ) method is used as a conversion method. Further, (4) an aliasing leakage component relating to the other frequency bands other than the frequency band specified in the condition (1) should be permitted such that a digital filter whose group delay which is generated in a processing mechanism in the inside of the conversion processing apparatus is suppressed to equal to or less than 1 ms should be used.

If an FIR filter which satisfies the conditions (1) and (4) described above is used for the decimation filter 1213 and the interpolation filter 1231 and the sampling frequency Fs satisfies the condition (2) while the conversion method satisfies the condition (3), then an ADC or a DAC of the Z-A type which is used in the past is used to construct the FB filter circuit 12 of digitalized formation.

It is to be noted that a detailed foundation that a digital filter which does not generate great delay can be formed where the conditions (1) to (4) described above are satisfied is described in detail in a copending Japanese Patent Application No. 2006-301211 by the inventor of the present application.

SUMMARY (1) Since one or more microphone mechanisms are provided on each of the inner side and the outer side of the headphone housing as in the noise canceling system described hereinabove with reference to FIG. 8 and a signal collected by the microphone provided on the outer side of the headphone housing is reproduced by a driver on the inner side of the headphone through a particular filter, noise leaking into the inside of the headphone is reduced. Simultaneously, since a signal collected by the microphone on the inner side of the headphone housing is reproduced by a driver on the inner side of the headphone housing through a particular filter, noise reduction by a greater attenuation effect amount can be performed over a wider frequency band by the noise canceling system.

(2) Since, as in the noise canceling system described hereinabove with reference to FIG. 12, the filtered signal of the inner side microphone and the filtered signal of the outer side microphone described in (1) above are mixed by an analog or digital mechanism, the number of drivers can be reduced to one.

(3) As described hereinabove with reference to FIGS. 6C, 9 and 15, a filter section implemented as an FB filter circuit or an FF filter circuit is configured as a digital filter by providing one or more ADC and one or more DAC in the system in order to perform digital filtering by means of an arithmetic operation device formed from a DSP or a CPU.

(4) As in the case of the noise canceling systems described hereinabove with reference to FIGS. 13 and 14, the system can be configured so as to have a first mode wherein both of output signals of the microphone on the inner side and the microphone on the outer side of the headphone housing enter an ADC, by which they are digitally processed and a second mode wherein the input of the microphone signal from the microphone on one of the inner and outer sides of the headphone housing is switched to an external signal (music signal or telephone conversion signal) and connected to the same ADC while an instruction is issued simultaneously to the DSP/CPU section to change over the program to be executed from the noise reduction program to the equalizer program.

In this instance, if the first mode is used, then a no-sound state of a high degree of quality can be formed, but if the second mode is used, then only one of the noise canceling system section of the feedback type and the noise canceling system section of the feedforward type can be caused to function so that, while noise is reproduced, the input sound of an external source is reproduced so as to be enjoyed by the hearing person. Further, by providing the first mode and the second mode, the number of ADCs can be suppressed.

Method According to the Invention

A first method of the present invention can be implemented by causing a first section which implements a noise canceling system of the feedback type and a second section which implements a noise canceling system of the feedforward type to function at the same time as described hereinabove with reference to FIG. 8 so that noise cancellation is performed simultaneously by the feedforward system as well as by the feedback system.

On the other hand, by allowing the DSP/CPU section 322 and the DAC 323 to be used commonly by the FB filter circuit 12 and the FF filter circuit 22 as described hereinabove such that noise reproduction signals are formed by the DSP/CPU section 322 and are synthesized as described hereinabove with reference to FIG. 12, a second method according to an embodiment of the present invention which uses the single power amplifier 33 and the single driver 34 to reduce noise effectively can be implemented.

Further, by forming the FB filter circuit 12 and the FF filter circuit 22 from an ADC, a DSP/CPU and a DAC so as to allow such processes as analog/digital conversion→noise reduction signal production process→digital/analog conversion, a third method according to an embodiment of the present invention can be implemented.

Further, by allowing the FB filter circuit 12 and the FF filter circuit 22 to be used commonly by the DSP/CPU section 322 and the DAC 323 as seen from FIG. 12, that is, by causing the DSP/CPU section 322 to form a noise reduction signal for the feedback system and further form a noise reduction signal for the feedforward system such that the noise reduction signals can be synthesized, a fourth method according to an embodiment of the present invention can be implemented.

Further, by performing changeover regarding which one of sound collected by a microphone and input sound S should be processed as seen in FIGS. 13 and 14, a fifth method according to an embodiment of the present invention can be implemented.

Others

It is to be noted that, in the embodiment described hereinabove, the noise canceling system section of the feedback type is formed principally by causing the microphone 111 to implement a function as a first sound collection section, by causing the FB filter circuit 12 to implement a function as a first signal processing section, by causing the power amplifier 14 to implement a function as a first amplification section and by causing the driver 15 including the speaker 152 to implement a function as a first sound emission section.

Meanwhile, the noise canceling system section of the feedforward type is formed principally by causing the microphone 211 to implement a function as a second sound collection section, by causing the FF filter circuit 22 to implement a function as a second signal processing section, by causing the power amplifier 24 to implement a function as a second amplification section and by causing the driver 25 including the speaker 252 to implement function as a second sound emission section.

Further, the FB filter circuit 12 and the FF filter circuit 22 implement a function as a synthesis section. Imitatively, the DSP/CPU which is a common element to the FB filter circuit 12 and the FF filter circuit 22 as seen in FIG. 12 has a function of forming noise reduction signals for the feedback system and the feedforward system and further has a function of synthesizing the thus formed noise reduction signals.

Then, the power amplifier 33 in FIG. 12 implements a function as a single amplification section for amplifying a single signal synthesized by the synthesis section, and the driver 34 implements a function as a single sound emission section for emitting sound in response to the signal amplified by the single amplification section. Further, the switch circuit 36 shown in FIG. 13 and the switch circuit 37 shown in FIG. 14 implement a function as a changeover section for changing over an output signal.

Further, while, in the embodiment described hereinabove, both of the FB filter circuit 12 and the FF filter circuit 22 have a configuration of a digital filter, according to the embodiment of the present invention, the configuration of the FB filter circuit 12 and the FF filter circuit 22 is not limited to this. Similar effects to those described above can be achieved also where the FB filter circuit 12 and the FF filter circuit 22 have a configuration of an analog filter.

Further, while, in the embodiment described hereinabove, input sound S is accepted as an external source, the function of accepting an external source need not necessarily be provided. In particular, the noise canceling system may be formed as a noise reduction system which can only reduce noise without the necessity for acceptance of an external source such as music.

Further, while, in the embodiment described hereinabove, the present invention is applied to a headphone system for the simplified description, all systems need not necessarily be incorporated in the headphone body. For example, also it is possible to separately provide such processing mechanisms as an FB filter circuit, an FF filter circuit and a power amplifier as a box on the outside or to combine them with a different apparatus. Here, the different apparatus may be various types of hardware which can reproduce a sound or music signal such as, for example, a portable audio player, a telephone apparatus and a network sound communication apparatus.

Particularly, where the present invention is applied to a portable telephone set and a headset to be connected to the portable telephone set, for example, even in a noisy environment outside, telephone conversation in a good condition can be anticipated. In this instance, if the FF filter circuit, FB filter circuit, drive circuit and so forth are provided on the portable telephone terminal side, then the configuration of the headset side can be simplified. Naturally, also it is possible to provide all components on the headset side such that it receives supply of sound from the portable telephone terminal.

While a preferred embodiment of the present invention has been described using specific terms, such description is for illustrative purpose only, and it is to be understood that changes and variations may be made without departing from the spirit or scope of the following claims.

What is claimed is:

1. A noise canceling system, comprising:

a first sound collection section provided on a housing to be attached to an ear portion of a user and configured to collect noise and output a first noise signal;

a first signal processing section configured to produce a first noise reduction signal for reducing the noise at a predetermined cancel point based on the first noise signal, wherein the noise corresponds to sound between approximately 80 and 300 Hz collected by the first sound collection section;

a second sound collection section provided on a sound emission direction side of said housing to be attached to the ear portion of the user with respect to said sound emission section and configured to collect noise and output a second noise signal;

a second signal processing section configured to produce a second noise reduction signal for reducing noise at the cancel point based on the second noise signal;

a synthesis section configured to synthesize a synthesized signal with the first noise reduction signal, the second noise reduction signal, and an input sound;

an amplifier configured to amplify the synthesized signal; and a sound emission section provided on the sound emission direction side with respect to said first sound collection section and configured to emit the amplified synthesized signal.

2. The noise canceling system according to claim 1, wherein said first signal processing section is a digital filter circuit including:

a first analog/digital conversion section configured to convert the first noise signal into a first digital noise signal;

a first processing section configured to produce a first digital noise reduction signal based on the first digital noise signal; and a first digital/analog conversion section configured to convert the first digital noise reduction signal into an analog noise reduction signal.

3. The noise canceling system according to claim 2, wherein said second signal processing section is a digital filter circuit including:

a second analog/digital conversion section configured to convert the second noise signal into a second digital noise signal;

the first processing section further configured to produce a second digital noise reduction signal based on the second digital noise signal; and the first digital/analog conversion section further configured to convert the second digital noise reduction signal into the analog noise reduction signal.

4. The noise canceling system according to claim 1, wherein said second signal processing section is a digital filter circuit including:

a second analog/digital conversion section configured to convert the second noise signal into a second digital noise signal;

a second processing section configured to produce a second digital noise reduction signal based on the second digital noise signal; and a second digital/analog conversion section configured to convert the second digital noise reduction signal into an analog noise reduction signal.

5. The noise canceling system according to claim 1, further comprising:

a first changeover section configured to perform changeover regarding which one of the first noise signal and the input sound signal from the outside should be supplied to said first signal processing section, and wherein said first signal processing section functions as an acceptance section for processing the input sound when said first changeover section supplies the input sound signal from the outside to said first signal processing section.

6. The noise canceling system according to claim 1, further comprising:

a second changeover section configured to perform changeover regarding which one of the second noise signal and the input sound signal from the outside should be supplied to said second signal processing section, and wherein said second signal processing section functions as an acceptance section for processing the input sound when said second changeover section supplies the input sound signal from the outside to said second signal processing section.

7. The noise canceling system according to claim 1, wherein the first signal processing section attenuates the noise at the predetermined cancel point over a first frequency band at a first level of attenuation and the second signal processing section attenuates the noise at the predetermined cancel point over a second frequency band at a second level of attenuation, the first frequency band being wider than the second frequency band and the second level of attenuation being greater than the first level of attenuation.

8. A noise canceling method, comprising:

a first sound collection step of allowing a first sound collection section provided on a housing, which is to be attached to an ear portion of a user, to collect noise and output a first noise signal;

a first signal processing step of producing a first noise reduction signal for reducing the noise at a predetermined cancel point based on the first noise signal, wherein the noise corresponds to sound between approximately 80 and 300 Hz collected by the first sound collection section;

a second sound collection step of allowing a second sound correction section provided on a sound emission direction side of the housing to be attached to the ear portion of the user with respect to the sound emission section to collect noise and output a second noise signal;

a second signal processing step of producing a second noise reduction signal for reducing noise at the cancel point based on the second noise signal;

a synthesis step of synthesizing a synthesized signal with the first noise reduction signal, the second noise reduction signal, and an input sound;

an amplifying step of amplifying the synthesized signal; and a sound emission step of allowing a sound emission section provided on the sound emission direction side with respect to the first sound collection section to emit the amplified synthesized signal.

9. The noise canceling method according to claim 8, wherein the first signal processing step includes:

a first analog/digital conversion step of converting the first noise signal into a first digital noise signal;

a first processing step of producing a first digital noise reduction signal based on the first digital noise signal; and a first digital/analog conversion step of converting the first digital noise reduction signal into an analog noise reduction signal.

10. The noise canceling method according to claim 8, wherein the second signal processing includes:

a second analog/digital conversion step of converting the second noise signal into a second digital noise signal;

a second processing step of producing a second digital noise reduction signal based on the second digital noise signal; and a second digital/analog conversion step of converting the second digital noise reduction signal into an analog noise reduction signal.

11. The noise canceling method according to claim 8, further comprising:

a first changeover step of performing changeover regarding which one of the first noise signal and the input sound signal from the outside should be processed at the first signal processing step.

12. The noise canceling method according to claim 8, further comprising:

a second changeover step of performing changeover regarding which one of the second noise signal and the input sound signal from the outside should be processed at the second signal processing step.

13. The noise canceling system according to claim 1, wherein the first sound collection section is a feedforward microphone, the first signal processing section is a feedforward type noise canceling system, the second sound collection section is a feedback microphone, and the second signal processing section is a feedback type noise canceling system.

* * * * *